United States Patent
Wang et al.

(10) Patent No.: US 12,066,590 B2
(45) Date of Patent: Aug. 20, 2024

(54) CREATION OF NEAR BIT GAMMA RAY IMAGE FROM A GAMMA RAY CURVE

(71) Applicant: Saudi Arabian Oil Company, Dhahran (SA)

(72) Inventors: Weihua Wang, Dhahran (SA); Yunsheng Li, Dhahran (SA)

(73) Assignee: Saudi Arabian Oil Company, Dhahran (SA)

( * ) Notice: Subject to any disclaimer, the term of this patent is extended or adjusted under 35 U.S.C. 154(b) by 218 days.

(21) Appl. No.: 17/715,269

(22) Filed: Apr. 7, 2022

(65) Prior Publication Data
US 2023/0324580 A1  Oct. 12, 2023

(51) Int. Cl.
| | |
|---|---|
| G01V 5/14 | (2006.01) |
| E21B 47/04 | (2012.01) |
| E21B 47/12 | (2012.01) |
| G01V 1/46 | (2006.01) |
| G01V 1/50 | (2006.01) |
| G01V 5/04 | (2006.01) |
| G06F 30/20 | (2020.01) |

(52) U.S. Cl.
CPC .............. *G01V 5/145* (2013.01); *E21B 47/04* (2013.01); *E21B 47/12* (2013.01); *G01V 1/46* (2013.01); *G01V 1/50* (2013.01); *G01V 5/045* (2013.01); *G06F 30/20* (2020.01)

(58) Field of Classification Search
CPC . G01V 5/145; G01V 5/46; G01V 5/50; G01V 5/045; E21B 47/04; E21B 47/12; G06F 30/20
See application file for complete search history.

(56) References Cited

U.S. PATENT DOCUMENTS 9,790,787 B2 * 10/2017 Parker .................... G01V 3/20

FOREIGN PATENT DOCUMENTS

| | | | |
|---|---|---|---|
| CN | 204899796 U | * | 12/2015 |
| WO | WO 2020149824 | | 7/2020 |

OTHER PUBLICATIONS

Baciarelli et al., "Accurate horizontal well placement through evaluation of multiple LWD images with geological modeling," 1st SPWLA India Regional Conference, Mar. 2007, 15 pages.

(Continued)

*Primary Examiner* — David P Porta
*Assistant Examiner* — Casey Bryant
(74) *Attorney, Agent, or Firm* — Fish & Richardson P.C.

(57) ABSTRACT

Systems and methods include a computer-implemented method for creating artificial real-time gamma ray (GR) images for well placement. Real-time azimuthal density data is determined from drilling of a well. An azimuthal density data set is generated using the real-time azimuthal density data. The azimuthal density data set is generated with a greater sampling rate than a real-time sampling rate of the real-time azimuthal density data. An azimuthal density curve depth match is performed using the azimuthal density data set. Performing the azimuthal density curve depth match includes creating a depth shift match table. A high-resolution sector near-bit gamma ray (GR) image is generated using the azimuthal density curve depth match and the depth shift match table. The high-resolution sector near-bit GR image is oriented to a top of a wellbore for the well.

20 Claims, 14 Drawing Sheets

(56) References Cited

OTHER PUBLICATIONS

Greiss et al., "Real-time density and gamma ray images acquired while drilling help to position horizontal wells in a structurally complex north sea field," SPWLA 44th Annual Logging Symposium, Jun. 2003, 11 pages.

* cited by examiner

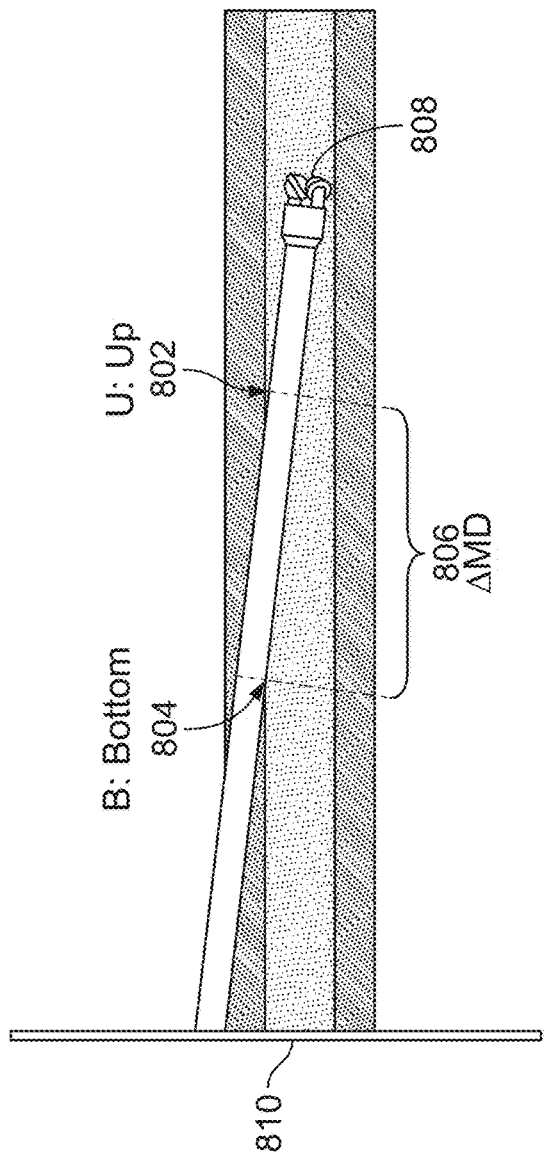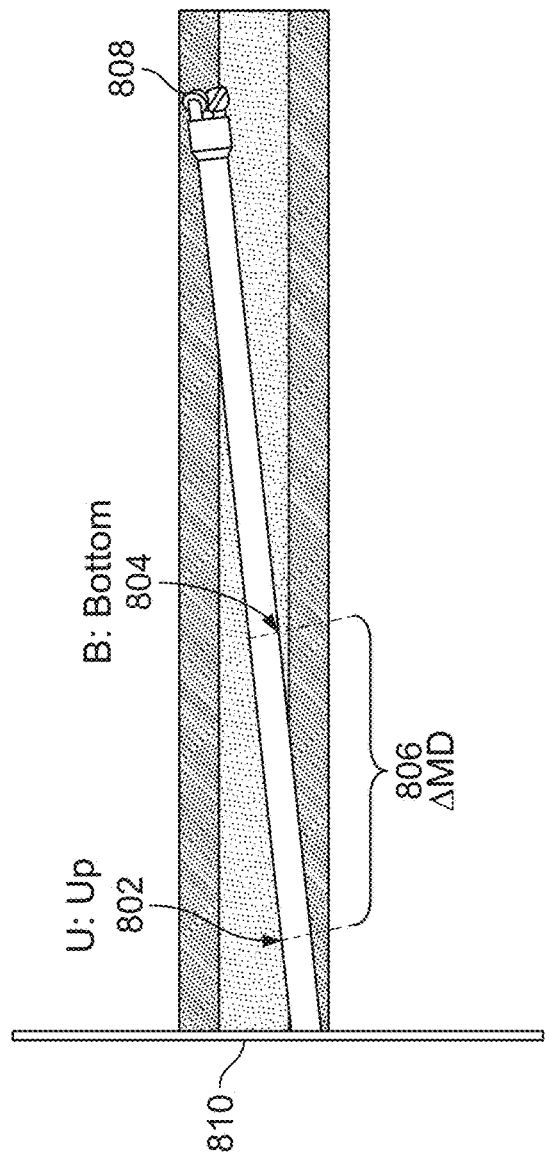

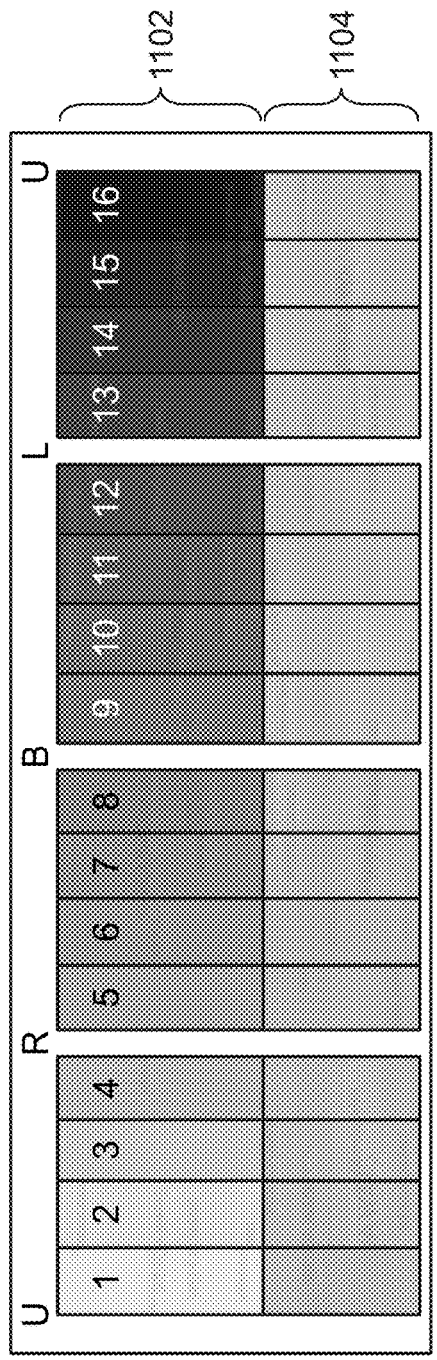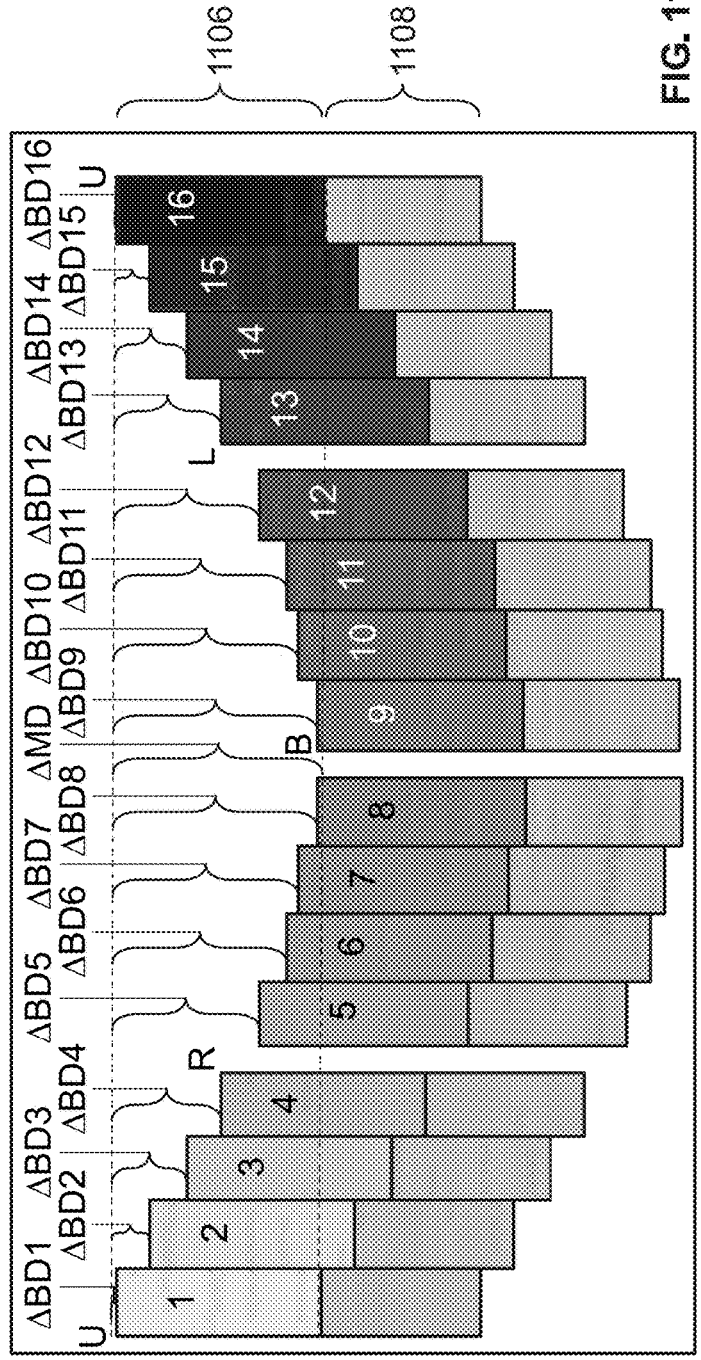
FIG. 11A
FIG. 11B

CREATION OF NEAR BIT GAMMA RAY IMAGE FROM A GAMMA RAY CURVE

TECHNICAL FIELD

The present disclosure relates to sandstone reservoir characterization and well placement.

BACKGROUND

Density images have been widely used by operators and provide various advantages for use in reservoir characterization and well placement. Advantages of using density images include the availability of a real-time density image that can provide stratigraphic information for well placement and hole shape information for mud weight adjustment. Another advantage is that density image tools are typically mud type independent and can be used in both oil- and water-based mud. However, a disadvantage is that density image sensors are typically far from the drill bit due to logging tool configurations (e.g., shown in FIGS. 1 and 2). Near bit images can be acquired by running additional services, such as by using near-bit gamma ray (GR) images or resistivity images with additional cost. In order to keep drilling costs to a minimum, many operators drill and geo-steer wells using density images only.

Over the past decades, real-time borehole images evolved from simple up-down azimuthal measurements through four sector/quadrant GR images, eight and 16 sector density images to the high resolution 120 sector resistivity images available today. These different images can now be acquired simultaneously in real-time, providing multiple images which complement dip calculations and supplement geological information.

SUMMARY

The present disclosure describes techniques that can be used for creating artificial real-time gamma ray (GR) images for well placement. In some implementations, a computer-implemented method includes the following. Real-time azimuthal density data is determined from drilling of a well. An azimuthal density data set is generated using the real-time azimuthal density data. The azimuthal density data set is generated with a greater sampling rate than a real-time sampling rate of the real-time azimuthal density data. An azimuthal density curve depth match is performed using the azimuthal density data set. Performing the azimuthal density curve depth match includes creating a depth shift match table. A high-resolution sector near-bit gamma ray (GR) image is generated using the azimuthal density curve depth match and the depth shift match table. The high-resolution sector near-bit GR image is oriented to a top of a wellbore for the well.

The previously described implementation is implementable using a computer-implemented method; a non-transitory, computer-readable medium storing computer-readable instructions to perform the computer-implemented method; and a computer-implemented system including a computer memory interoperably coupled with a hardware processor configured to perform the computer-implemented method, the instructions stored on the non-transitory, computer-readable medium.

The subject matter described in this specification can be implemented in particular implementations, so as to realize one or more of the following advantages. Cost savings can be realized by not needing to run near bit gamma ray (GR) image tools, since available data can be used to create additional near bit images without any additional physical image tools. Techniques of the present disclosure can provide additional information for well placement decision making, conducting daily well placement operations, and for real-time decision-making and better well placement results in clastic reservoirs. The term real-time can correspond, for example, to events that occur within a specified period of time, such as within a minute or within a second. Big oil and gas companies can use the techniques as being more cost effective compared to traditional methods. The techniques are an improvement over conventional which require running GR image tool to get the near bit GR image, leading to additional operational costs. Techniques of the present disclosure can utilize minimum acquired data, and can produce a sixteen sector near bit GR image from a near bit GR log. Techniques of the present disclosure are more cost effective and efficient for use in near bit stratigraphy features identification for decision making and better well placement.

The details of one or more implementations of the subject matter of this specification are set forth in the Detailed Description, the accompanying drawings, and the claims. Other features, aspects, and advantages of the subject matter will become apparent from the Detailed Description, the claims, and the accompanying drawings.

DESCRIPTION OF DRAWINGS

FIGS. 8A and 8B are diagrams showing examples of schematics for cutting down and cutting up, respectively, while drilling horizontal wells, according to some implementations of the present disclosure.

FIGS. 11A and 11B are diagrams showing examples of sixteen sector density bin images, according to some implementations of the present disclosure.

Like reference numbers and designations in the various drawings indicate like elements.

DETAILED DESCRIPTION

The following detailed description describes techniques for creating artificial real-time gamma ray (GR) images for well placement. Various modifications, alterations, and permutations of the disclosed implementations can be made and will be readily apparent to those of ordinary skill in the art, and the general principles defined may be applied to other implementations and applications, without departing from the scope of the disclosure. In some instances, details unnecessary to obtain an understanding of the described subject matter may be omitted so as to not obscure one or more described implementations with unnecessary detail and inasmuch as such details are within the skill of one of ordinary skill in the art. The present disclosure is not intended to be limited to the described or illustrated implementations, but to be accorded the widest scope consistent with the described principles and features.

Figure 1:
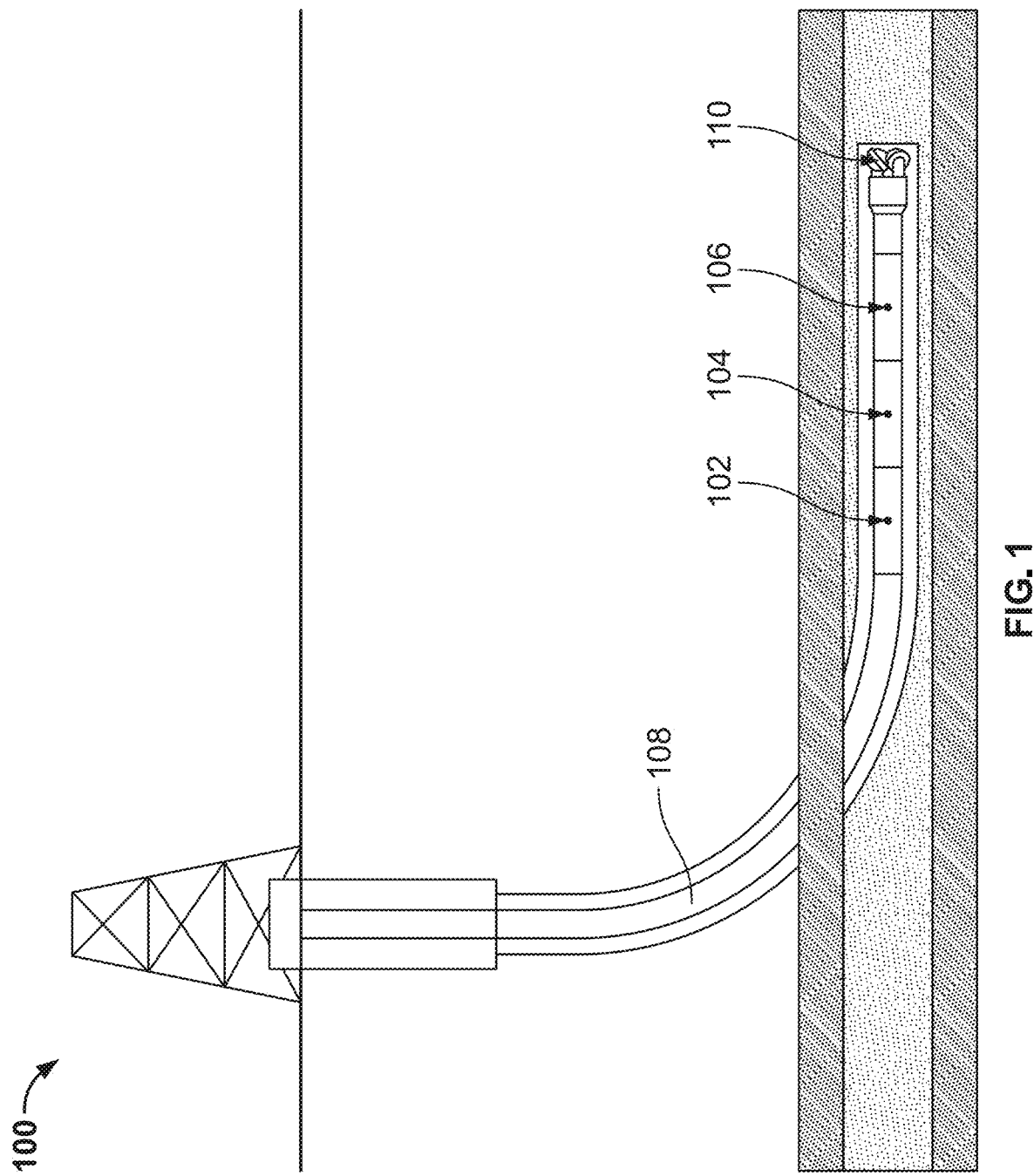
FIG. 1 is a diagram showing an example of a common logging while drilling (LWD) logging tool configuration, according to some implementations of the present disclosure.

Techniques of the present disclosure can be used to create a near-bit GR image from a GR curve by utilizing existing real-time azimuthal density data to assist well placement on top of the density image. The most common LWD logging tool configuration is GR, resistivity and density from drill bit to drill pipe (FIG. 1). An artificial near-bit GR image can provide an operator with greater insight into the stratigraphy for well placement, and can reduce the real-time to time-critical geo-steering decision-making process.

Figure 3:
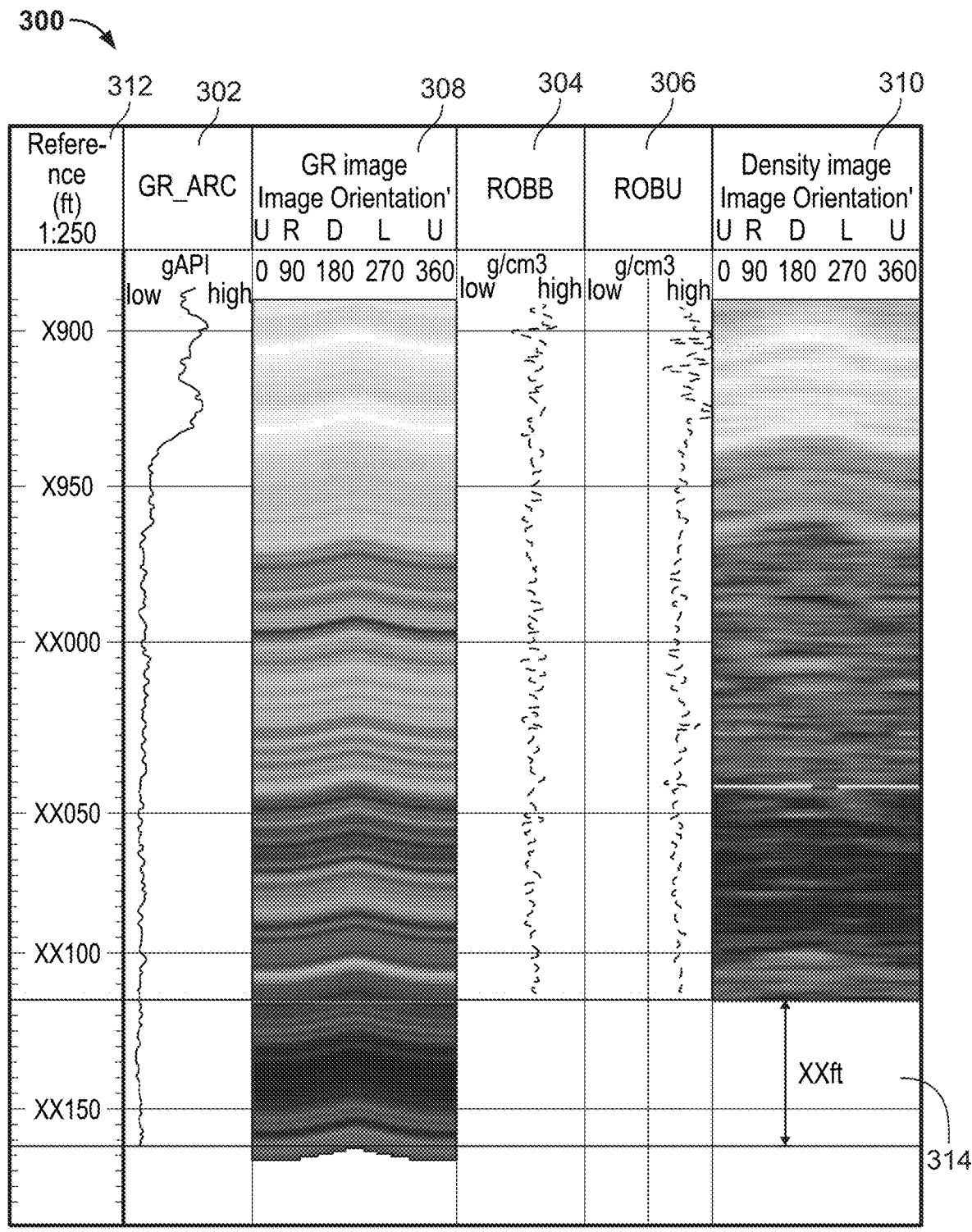
FIG. 3 is a diagram showing an example of a composite plot showing different LWD logs and images plotted relative to a depth index, according to some implementations of the present disclosure.

Artificial near bit GR images can be compared with the density image from the same wellbore, which is typically dozens of feet behind the artificial near bit GR image, and shown with similar stratigraphic features (FIG. 3). Artificial near bit GR images typically show a much better image in clastic rocks, since GR images show higher contrast than density images while suffering fewer effects brought on by borehole conditions (FIG. 3).

The positioning of the imaging tools in the BHA can be critical in obtaining timely real-time data for decision-making. Real-time images can be obtained using density, gamma ray, and resistivity sensors, enabling images to be obtained in all drilling fluid environments. The real-time structural information provided by these images in conjunction with other real-time LWD petrophysical logs can provide a close-to-the-bit visualization for in-time geo-steering decisions. By capturing a more detailed analysis of the formation, structure, and reservoir geometry, the techniques of the present disclosure can provide a greater ability to optimize well placement and extent the reservoir. For example, optimizing well placement can refer to achieving well placement locations that result in a performance greater than a predefined threshold.

Density images are widely used by operators due to various advantages, such as real-time density images that provide stratigraphic information for well placement, hole shape information, for mud weight adjustment. Another advantage is that density image tools are mud type independent and run in both oil- and water-based mud. However, density image sensors are typically far from the drill bit due to the logging tool configurations (e.g., as shown in FIG. 1). Near bit images can be acquired by running additional services, such as, near-bit GR images, or resistivity images with additional cost. The uses of real-time density and gamma ray images for geo-steering purposes are well described in the industry. Accurate horizontal well placement through evaluation of multiple LWD images with geological modeling have been evaluated. New methods for "azimuthal borehole rendering of radioelement spectral gamma data" can be used. However, for all operators, drilling costs must be kept to a minimum, and many operators drill and geo-steer the well with density images only.

Figure 4:
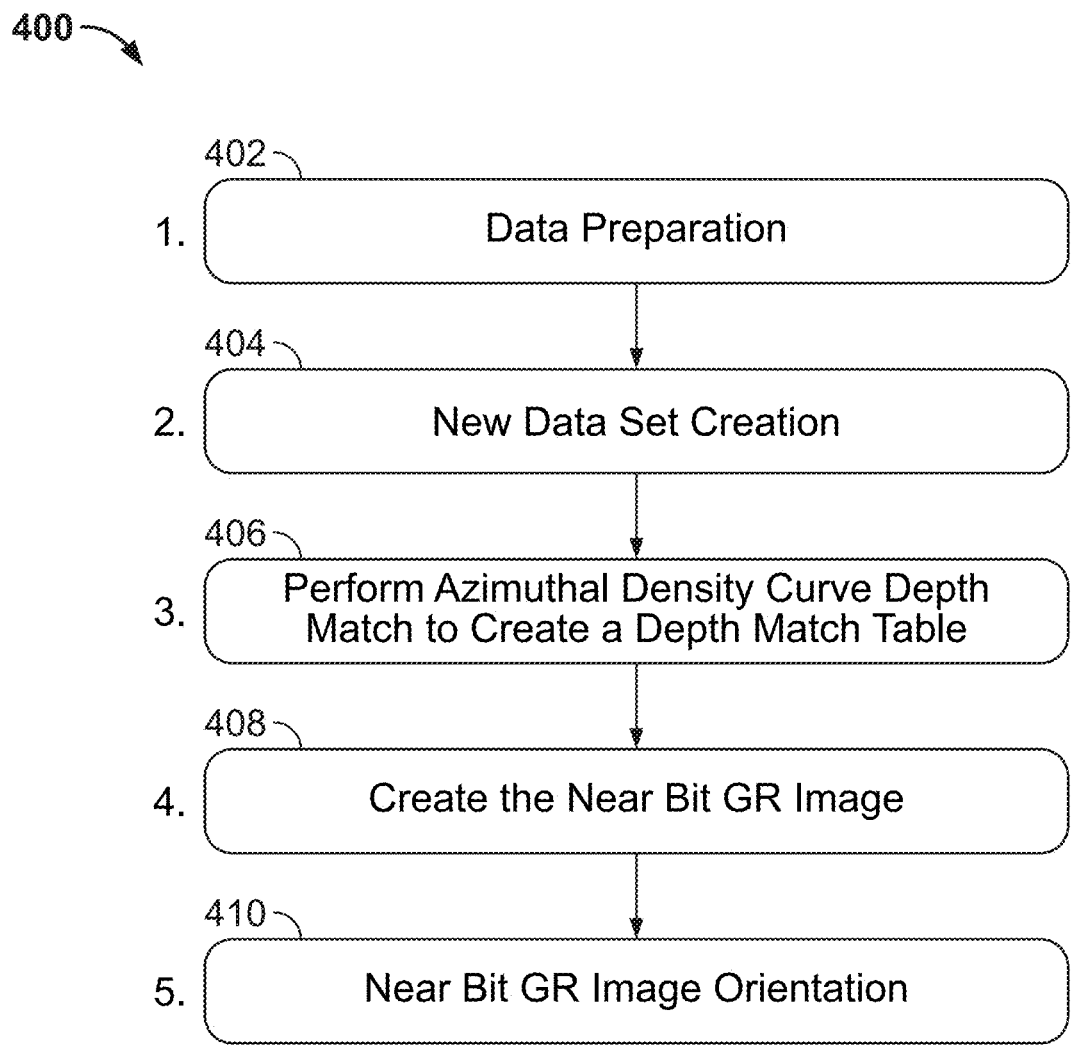
FIG. 4 is a diagram showing an example of a workflow, according to some implementations of the present disclosure.

Techniques of the present disclosure can include several steps, including a first step of the data preparation (FIG. 4). The real-time azimuthal density data can be downloaded, including four azimuthal density curves (e.g., up, down, left, and right in FIG. 5A) and the sixteen bin density image (FIG. 5B), survey data, and near bit GR log. Then the data can be uploaded to a third-party software for artificial near bit GR image creation.

A second step of the workflow of FIG. 4 is to create a new data set with higher sampling rate (e.g., 0.1 inch) since the sampling rate for real-time data is 6 inches and not high enough for borehole image creation. The high sampling rate data set can allow for a more precise depth match as well, consequently, and to create the high resolution artificial near bit GR image.

Figure 6:
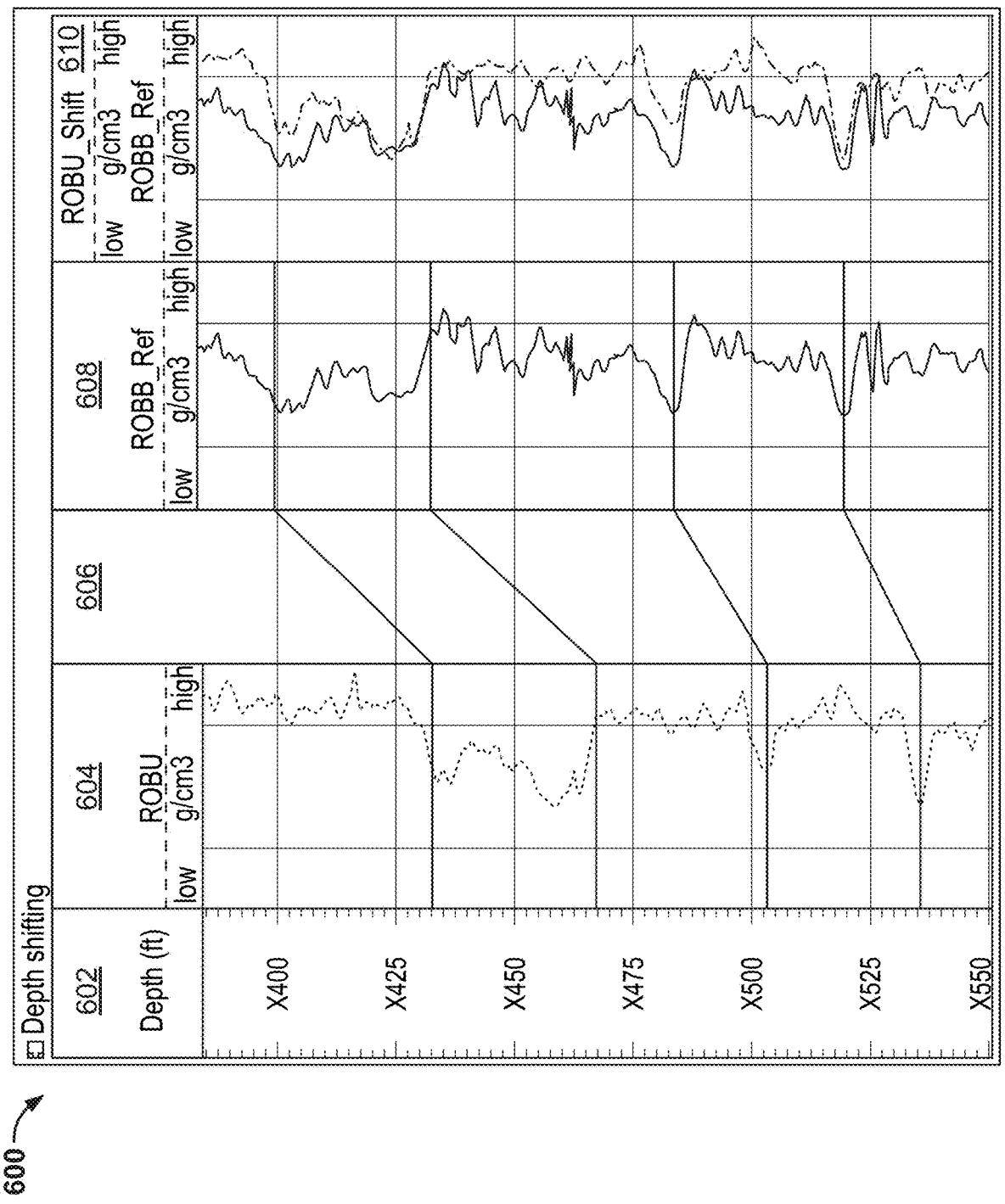
FIG. 6 is a diagram showing an example of a density composite plot showing a depth match window for a cutting down section, according to some implementations of the present disclosure.
Figure 7:
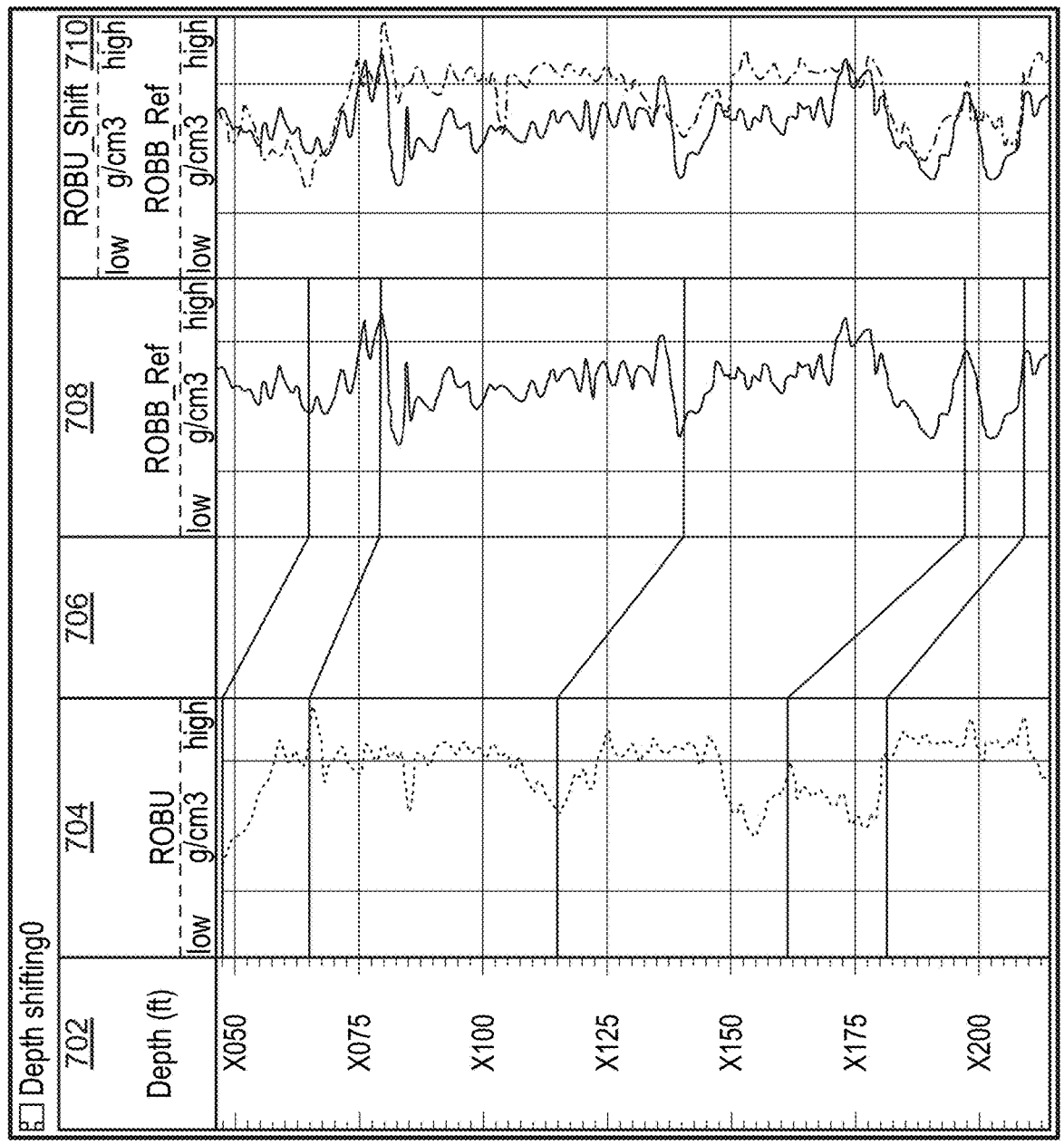
FIG. 7 is a diagram showing an example of a density composite plot showing depth match window for cutting up section, according to some implementations of the present disclosure.
Figure 9:
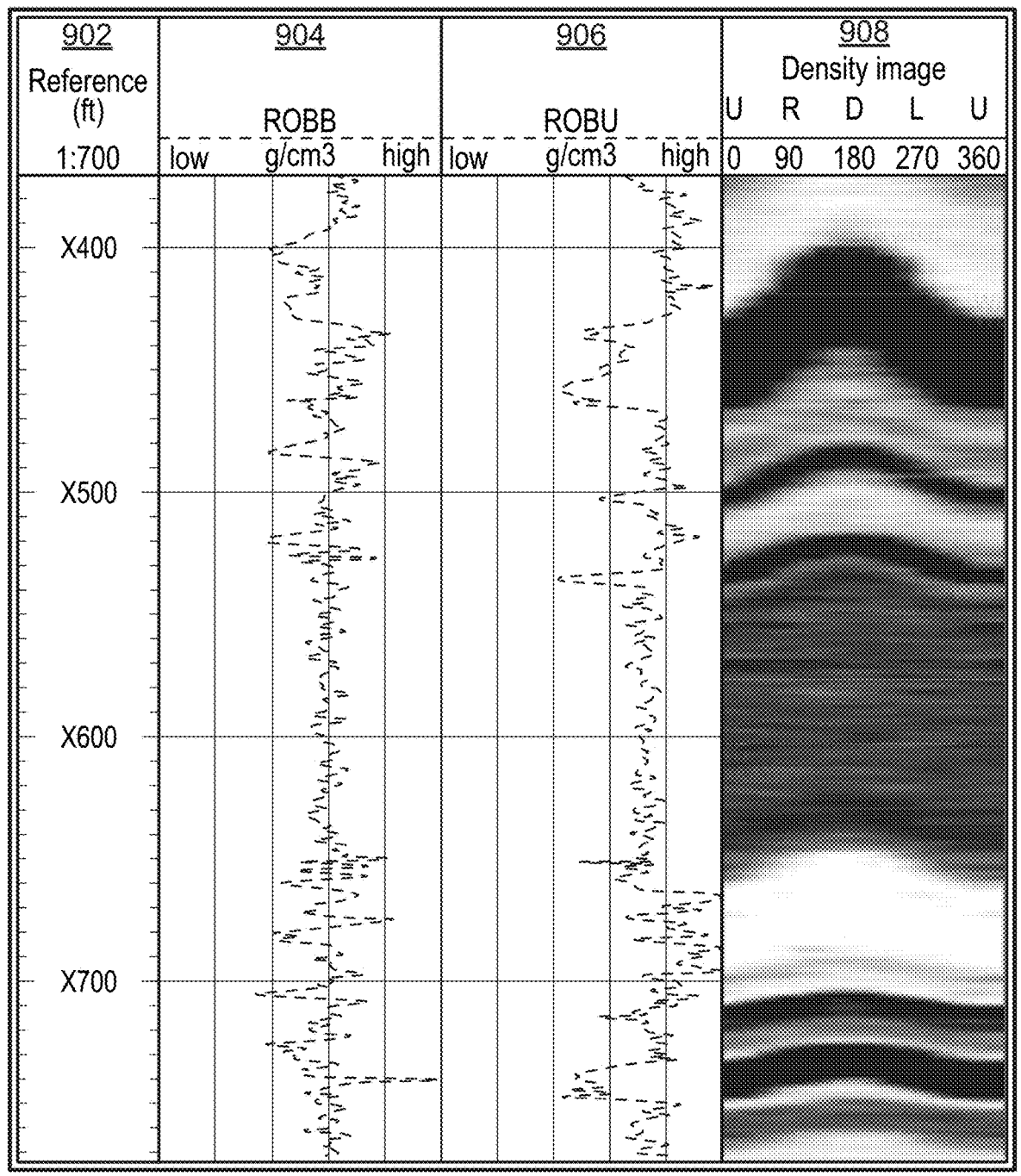
FIG. 9 is a diagram showing an example of a composite plot of a cutting down formation, according to some implementations of the present disclosure.
Figure 10:
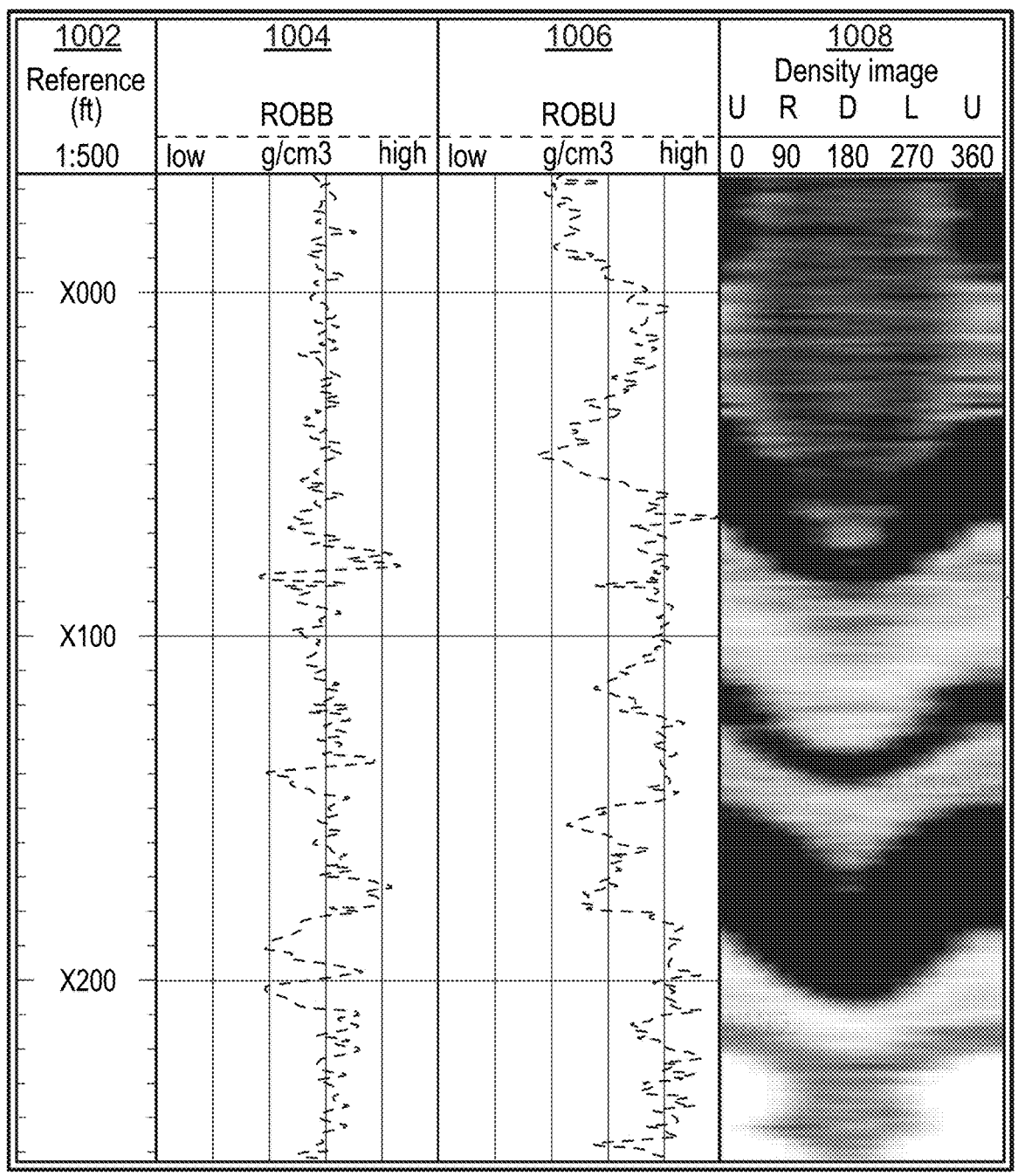
FIG. 10 is a diagram showing an example of a composite plot of a cutting up formation, according to some implementations of the present disclosure.

Up (ROBU) and down/bottom (ROBB) azimuthal density curve depth match is performed to create depth shift table (FIGS. 6 and 7, and Table 1). Azimuthal density (up/down) are often shown in depth differences in horizontal wells due to the wellbore geometry and stratigraphy change (FIGS. 8A-8B). A "sad face" appearing on density images reflects a cutting down feature, and the upper density curve is deeper in measured depth (MD) than bottom density curve for the same bedding feature (FIG. 9). A "happy face" appearing on density images reflects a cutting up feature, and the upper density curve is shown with shallower depth in MD than bottom density curve for the same bedding feature (FIG. 10).

Figure 12:
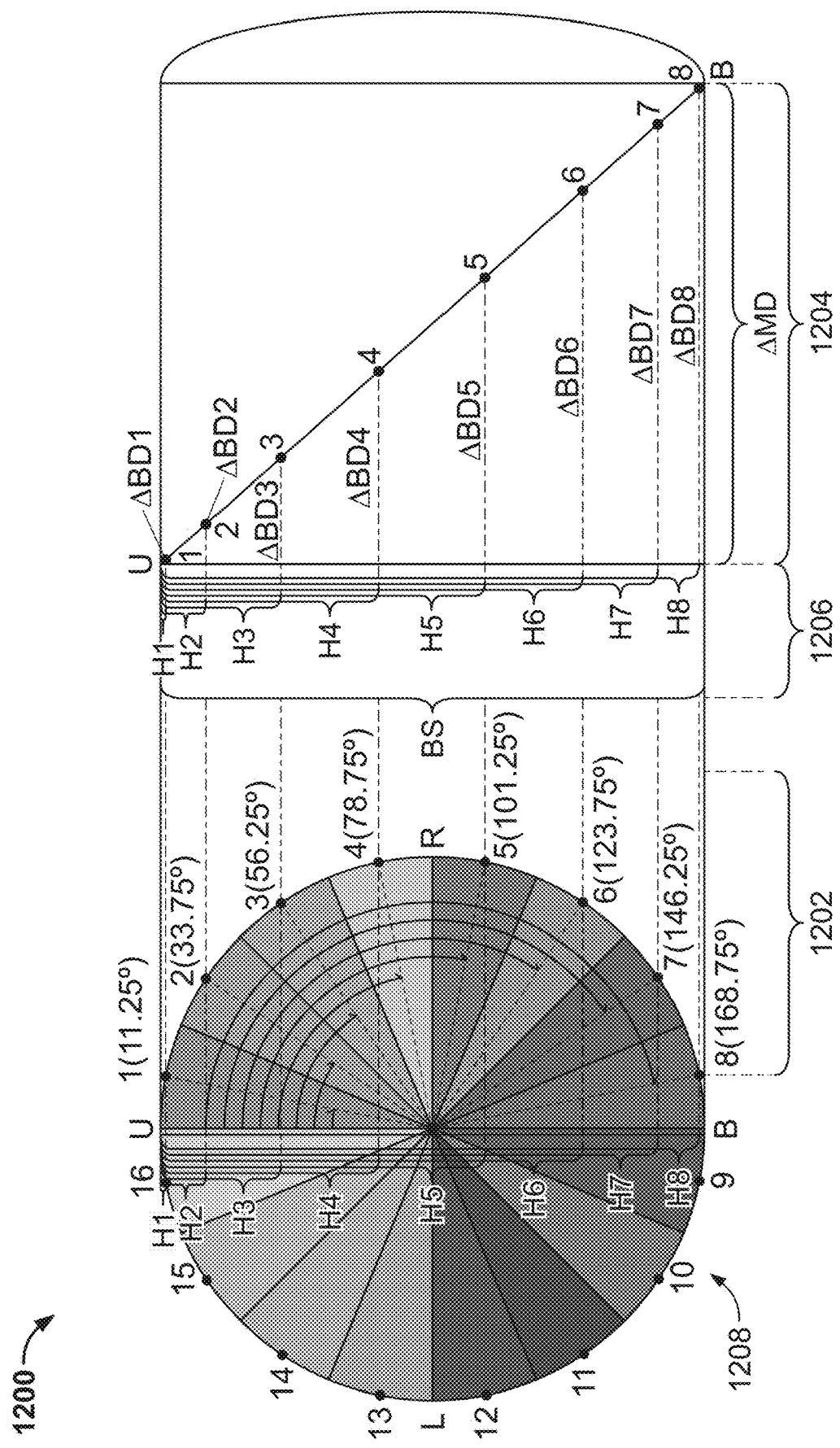
FIG. 12 is a diagram showing an example of a schematic diagram showing a cutting up case while drilling horizontal wells, according to some implementations of the present disclosure.

High resolution sector near bit GR images can be created based on a depth match table derived from an azimuthal density log by using an upper density log and a down/bottom density log (FIGS. 11A-11B). The angle for each sector is 360° divided by n (where n is number of sectors). The angle for each sector will be 22.5° for a 16 sector image, for example. Each sector image can be positioned at the middle of each sector, and the first sector image can be locked, for example, at 11.25° on the upper right quadrant of the wellbore for a horizontal well (FIG. 12). The other sector image position can be expressed as:

$$\text{Bin\_}n \text{ image} = n \times 22.5° - 11.25° \text{ (for } n=1 \text{ to 16)} \tag{1}$$

where each Bin_n is a sector image.

When the well is cut down the formation, the bottom side of the drill bit will touch the formation first, and the upper side of the drill bit will reach the same feature later (See FIG. 8A). When the well is cut up the formation, the up side of the drill bit will touch the formation first and the down/bottom side of the drill bit will reach the same feature later (FIG. 8B). The distance between an upper density and a down/bottom density is the measured depth difference (ΔMD) along the well bore axe. The techniques of the present disclosure can use the ΔMD derived from azimuthal density and apply to GR log to create a GR image. Sixteen (16) GR logs can be duplicated simultaneously, and then the ΔMD derived from azimuthal density log can be applied to GR logs to create a GR image (FIG. 11B).

Assume the distances along the wellbore axe for each sector bin image are ΔBD1, ΔBD2, ΔBD3, ΔBD16 (FIGS. 11B and 12). Then, for similar triangles:

$$\frac{\Delta MD}{BS} = \frac{\Delta BD1}{H1} = \frac{\Delta BD2}{H2} = \ldots = \frac{\Delta BD8}{H8} \quad (2)$$

where BS is bit size and Hn is a vertical distance from upper side for each sector image projected to the upper-down/bottom vertical line. Each Hn can be expressed as:

$$Hn = BS/2 - (BS/2) \times (\cos(n \times 22.5° - 11.25°)) \quad (3)$$

where:

$$\Delta BDn = \quad (4)$$

$$\frac{\Delta MD \times Hn}{BS} = \frac{\Delta MD \times (BS/2 - (BS/2) \times (\cos(n \times 22.5° - 11.25°)))}{BS}$$

and where:

$$\frac{\Delta MD \times (1 - \cos(n \times 22.5° - 11.25°))}{2} (for\ n:1-8 \quad (5)$$

The distance from the upper side for 9-16 bin images is the same as for 8-1 bin images, respectively, as illustrated in FIG. 11B. Each bin image distance from the upper side is a function of ΔMD and a bin image angle away from the upper side along the intersection circle (FIG. 12). Consequently, the distance from the upper side can be calculated for all the bin images for a given ΔMD (Table 2).

During texting and experimentation of the techniques of the present disclosure, a Python script was programmed to generate a 16-sector near bit GR image. The image can be utilized for better well placement during drilling since the new created GR image is closer to the drill bit as compared to the real-time density image. A GR image can be oriented easily to the top of the hole, e.g., by associating the survey data and hole size for dip interpretation.

Table 1 is a depth match table derived from azimuthal density log. In Table 1, ΔMD is the Up-Bottom. Table 2 shows the relative sector button image shift needed to be applied to any given ΔMD derived from azimuthal density log to create the near bit GR image.

TABLE 1

Depth Match Table Derived From Azimuthal Density Log

| Bottom (feet) | Up (feet) | ΔMD (feet) |
|---|---|---|
| x047.293 | x064.686 | 17.393 |
| x065.44 | x079.643 | 14.203 |
| x115.062 | x140.662 | 25.6 |
| x161.703 | x197.297 | 35.594 |
| x181.113 | x209.168 | 28.055 |
| x432.45 | x399.135 | −33.315 |
| x467.168 | x432.275 | −34.893 |

TABLE 1-continued

Depth Match Table Derived From Azimuthal Density Log

| Bottom (feet) | Up (feet) | ΔMD (feet) |
|---|---|---|
| x503.113 | x483.65 | −19.463 |
| x535.551 | x519.244 | −16.307 |

Table 2 lists a coefficient value of each sector image for a given ΔMD value.

TABLE 2

Coefficient Value Of Each Sector Image for a Given ΔMD Value

| | |
|---|---|
| ΔBD1 | 0.009607359 ΔMD |
| ΔBD2 | 0.084265191 ΔMD |
| ΔBD3 | 0.222214877 ΔMD |
| ΔBD4 | 0.402454827 ΔMD |
| ΔBD5 | 0.597545173 ΔMD |
| ΔBD6 | 0.777785123 ΔMD |
| ΔBD7 | 0.915734809 ΔMD |
| ΔBD8 | 0.990392641 ΔMD |
| ΔBD9 | 0.990392641 ΔMD |
| ΔBD10 | 0.915734809 ΔMD |
| ΔBD11 | 0.777785123 ΔMD |
| ΔBD12 | 0.597545173 ΔMD |
| ΔBD13 | 0.402454827 ΔMD |
| ΔBD14 | 0.222214877 ΔMD |
| ΔBD15 | 0.084265191 ΔMD |
| ΔBD16 | 0.009607359 ΔMD |

Techniques of the present disclosure can be tested using real LWD data, e.g., using a comparison of a newly created near bit GR image and the density image from the same wellbore showing similar stratigraphic features. The new created GR image can provide better image contrast in clastic rocks, and provide nearly 100 feet additional image ahead of density image. An example of an artificial near bit GR image and comparison with the density image from the same wellbore section is shown in FIG. 3.

FIG. 1 is a diagram showing an example of a common logging while drilling (LWD) logging tool configuration 100, according to some implementations of the present disclosure. The LWD logging tool configuration 100 can be used during drilling operations, such as for an oil well. Information gathered by the LWD logging tool configuration 100 common log includes GR information (e.g., obtained a gamma ray sensor 106), resistivity information (e.g., obtained using a resistivity sensor 104), and density information (e.g., obtained using density sensor 102). The sensors 102, 104, and 106 can be in a drillstring 108 upstring of a drill bit 110.

Figure 2:
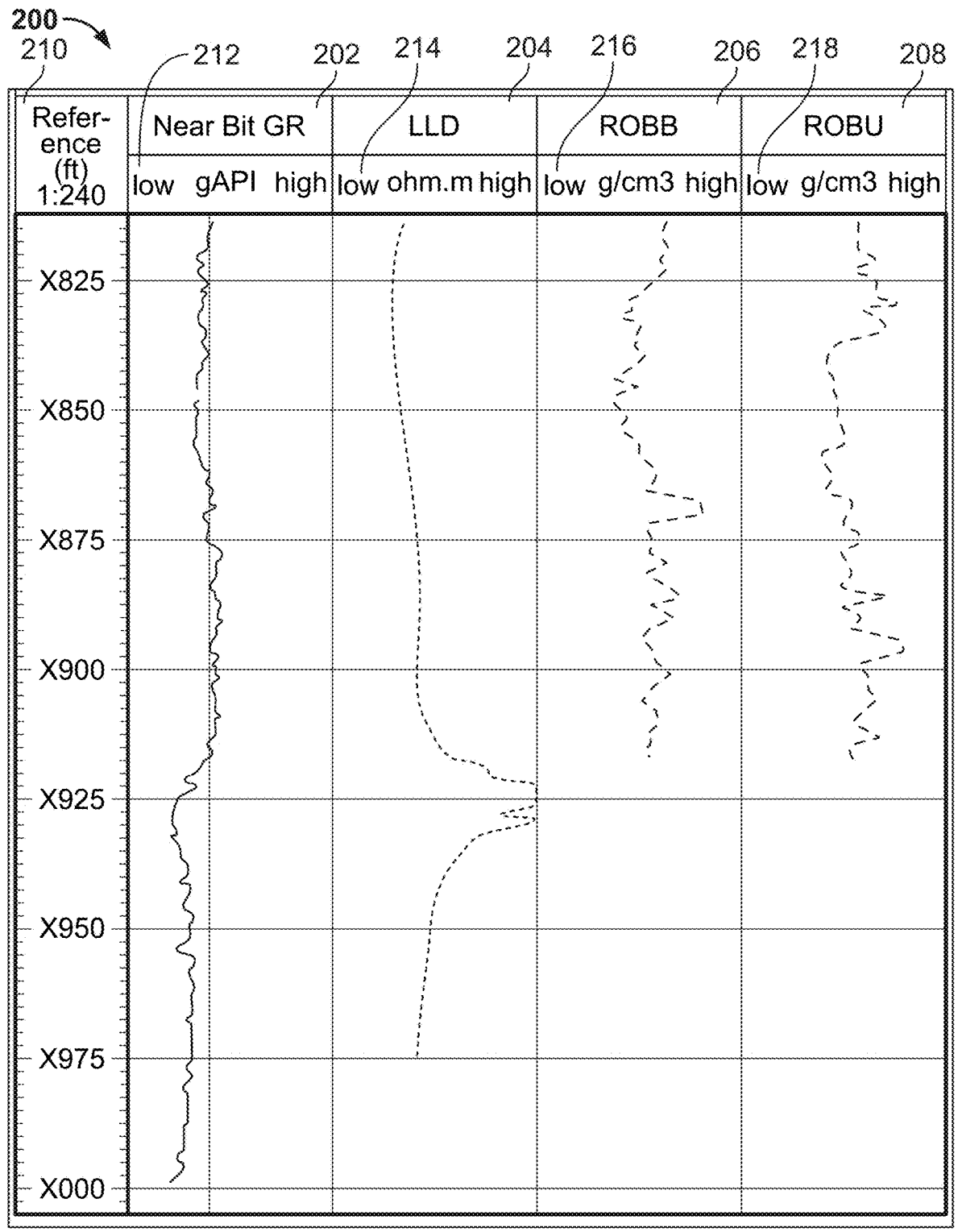
FIG. 2 is a diagram showing an example of a composite plot showing different LWD logs at depths of reference, according to some implementations of the present disclosure.

FIG. 2 is a diagram showing an example of a composite plot 200 showing different LWD logs 202-208 at depths of reference 210, according to some implementations of the present disclosure. Each of the different LWD logs 202-208 is plotted relative to a distance 210 from drill bit due to the LWD tool configuration, and the near bit GR is the closest sensor to the drill bit. The composite plot 200 includes a first track showing a depth index provided by the depths of reference 210 (e.g., in feet). A second track is a near bit GR log 202, with GR values plotted relative to the depths of reference 210 and an American Petroleum Industry gamma ray unit (gAPI) scale 212 ranging from low to high. A third track is a resistivity log 204 (e.g., a Deep Later Log (LLD)), with resistivity values plotted relative to the depths of reference 210 and a resistivity scale 214 of ohms per meter (ohm·m) ranging from low to high. A fourth track is a bottom density curve 206, with density values plotted relative to the depths of reference 210 and a density scale 216 of grams per cubic centimeter (g/cm$^3$) ranging from low to high. A fifth track is an upper density curve 208, with density values plotted relative to the depths of reference 210 and a density scale 218 g/cm$^3$ units ranging from low to high.

FIG. 3 is a diagram showing an example of a composite plot 300 showing different LWD logs 302, 304, and 306 and images 308 and 310 plotted relative to a depth index 312, according to some implementations of the present disclosure. Components of the composite plot 300 show that, based on the LWD tool configuration, the different sensors are located on the drillstring in different places and distances from drill bit due. For example, the near bit GR is the closest sensor to the drill bit. The composite plot 300 includes six tracks, where the first track is the depth index 312, the second track is a near bit GR log 302, the third track is a near bit GR image 308 created from the near bit GR log 302, the fourth track is a bottom density curve 304, the fifth track is an upper density curve 306, and the sixth track is a density image 310. The density image 310 can be derived from the sixteen sector density image. A depth difference 314 of xx feet (ft) exists because the GR sensor and the density sensor have different distances from drill bit, so the density sensor achieves a lesser depth than the GR sensor.

FIG. 4 is a diagram showing an example of a workflow 400, according to some implementations of the present disclosure. At 402, data preparation occurs, including downloading real-time azimuthal density data, including four azimuthal density curves (e.g., up, down, left, and right in FIG. 5A) and the sixteen bin density image (FIG. 5B), survey data, and near bit GR log. Then, the data is uploaded to a third-party software platform for artificial near bit GR image creation. At 404, a new data set is created, including creating a new data set with a higher sampling rate (e.g., 0.1 inch) since the sampling rate for real-time data is 6 inches and not high enough for borehole image creation. The higher sampling rate data set can allow for a more precise depth match as well, and can be used to create the high resolution artificial near bit GR image by depth matching Up (ROBU) and down/bottom (ROBB) azimuthal density curves. Azimuthal density (up/down) are often shown in depth differences in horizontal wells due to the wellbore geometry and stratigraphy change. A "sad face" appearing on density images reflects a cutting down feature, and the upper density curve is deeper in measured depth (MD) than the bottom density curve for the same bedding feature. A "happy face" appearing on density images reflects a cutting up feature, and the upper density curve is shown with shallower depth in MD than the bottom density curve for the same bedding feature.

At 408, a near bit GR image is created (e.g., an image similar to the image 308). At 410, near bit GR image orientation occurs. High resolution sector near bit GR images can be created based on a depth match table derived from an azimuthal density log by using an upper density log and a down/bottom density log, and the coefficient value of each sector image for a given ΔMD value for each sector bin image can be combined through a Python program prepared for the near bit GR image creation.

At 410, a near bit oriented GR image is created by associated bit size, hole deviation and hole azimuth data. The created image can be utilized for well placement.

Figure 5A:
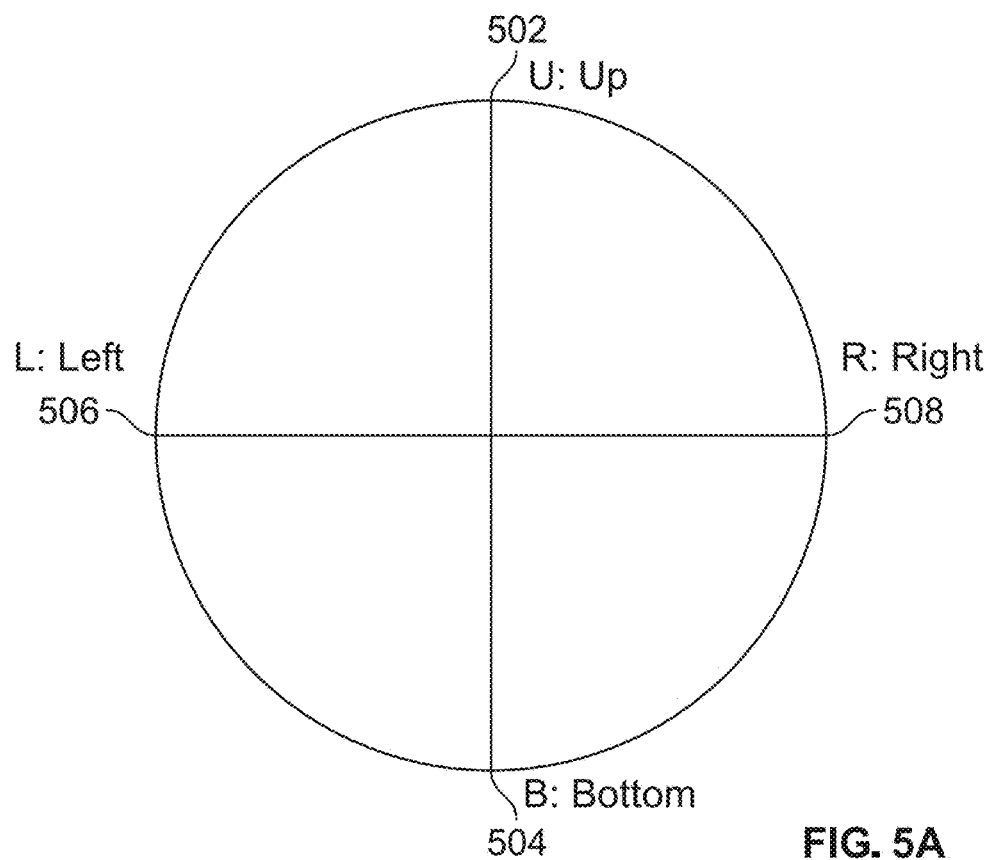
FIGS. 5A and 5B are diagrams illustrating azimuthal density curve positions, according to some implementations of the present disclosure.
Figure 5B:
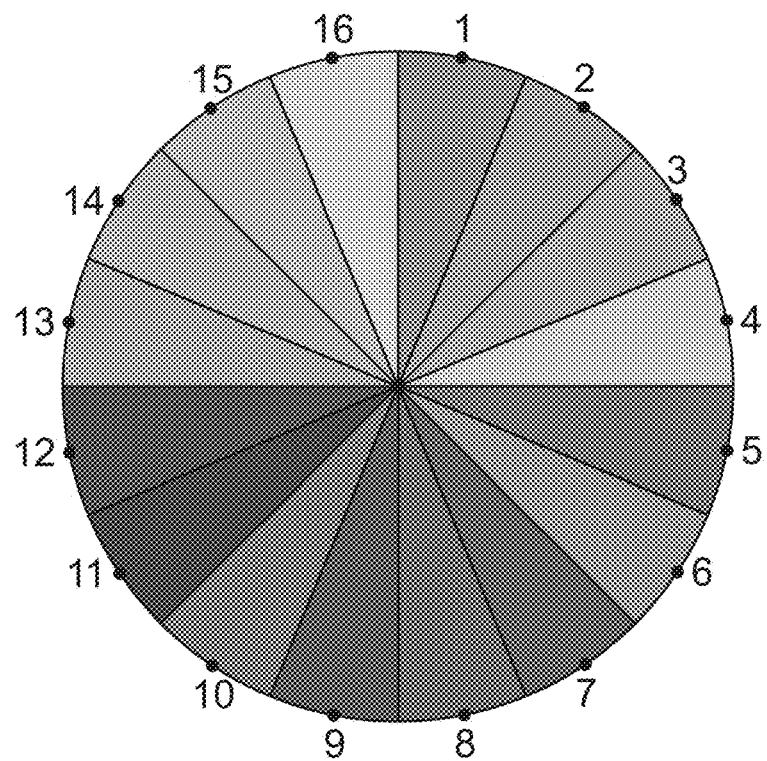

FIGS. 5A and 5B are diagrams illustrating azimuthal density curve positions, according to some implementations of the present disclosure. FIG. 5A shows four azimuthal density curve positions, an up (U) position 502, a bottom (B) position 504, a left (L) position 506, and a right (R) position 508. FIG. 5B shows sixteen sector bin density image positions in a horizontal wellbore intersection.

FIG. 6 is a diagram showing an example of a density composite plot 600 showing a depth match window for a cutting down section, according to some implementations of the present disclosure. FIG. 6 includes five tracks and shows depth match windows for cutting down sections. The first track is a depth index 602. The second track is an upper density curve 604. The third track is the depth difference 606 between the upper density curve 604 and a bottom density curve 608. The fourth track is the bottom density curve 608 (used as a reference curve for a depth match). The fifth track is a density shift curve 610, showing a shift between the bottom density curve 608 and a shifted representation of the upper density curve 604.

FIG. 7 is a diagram showing an example of a density composite plot 700 showing depth match window for cutting up section, according to some implementations of the present disclosure. FIG. 7 includes five tracks and shows depth match windows for cutting up sections. The first track is a depth index 702. The second track is an upper density curve 704. The third track is the depth difference 706 between the upper density curve 704 and a bottom density curve 708. The fourth track is the bottom density curve 708 (used as a reference curve for a depth match). The fifth track is a density shift curve 710, showing a shift between the bottom density curve 708 and a shifted representation of the upper density curve 704.

FIGS. 8A and 8B are diagrams showing examples of schematics for cutting down and cutting up, respectively, while drilling horizontal wells, according to some implementations of the present disclosure. In FIG. 8A, a measured depth difference 806 is a difference between the depths of an upper side 802 and a bottom side 804 of a drill bit 808 as the drill bit cuts downward to lower depths 810. In FIG. 8B, the measured depth difference 806 is a difference between depths of the upper side 802 and the bottom side 804 of the drill bit 808 as the drill bit cuts upward to higher depths 810.

FIG. 9 is a diagram showing an example of a composite plot 900 of a cutting down formation, according to some implementations of the present disclosure. The composite plot 900 includes four tracks. A first track is a depth index 902. A second track is a bottom density curve 904. A third track is an upper density curve 906. A fourth track is a sixteen sector density image 908 corresponding to a density image derived from density tool direct measurements.

FIG. 10 is a diagram showing an example of a composite plot 1000 of a cutting up formation, according to some implementations of the present disclosure. The composite plot 1000 includes four tracks. A first track is a depth index 1002. A second track is a bottom density curve 1004. A third track is an upper density curve 1006. A fourth track is a sixteen sector density image 1008 corresponding to a density image derived from density tool direct measurements.

FIGS. 11A and 11B are diagrams showing examples of sixteen sector density bin images, according to some implementations of the present disclosure. FIG. 11A shows a sector density bin image and relationships with four azimuthal density curves. Dark colored section 1102 has higher density than light colored section 1104 along the wellbore 1110. FIG. 11B shows a distance for each bin image from the upper side. Dark colored layer 1106 has higher density than light colored layer 1108 along the wellbore 1110.

FIG. 12 is a diagram showing an example of a schematic diagram 1200 showing a cutting up case while drilling horizontal wells, according to some implementations of the present disclosure. FIG. 12 shows each bin image distance 1204 from the upper side is the function of ΔMD and bin image angle 1202 away from the upper side along the intersection circle. Vertical distances (Hn) 1206 are vertical distances from the upper side for each sector image projected to the upper-down/bottom vertical line. The distance from the upper side for 9-16 bin images 1208 is the same as for 8-1 bin images 1202, 1204, and 1206, respectively, as illustrated in the schematic diagram 1200.

Figure 13:
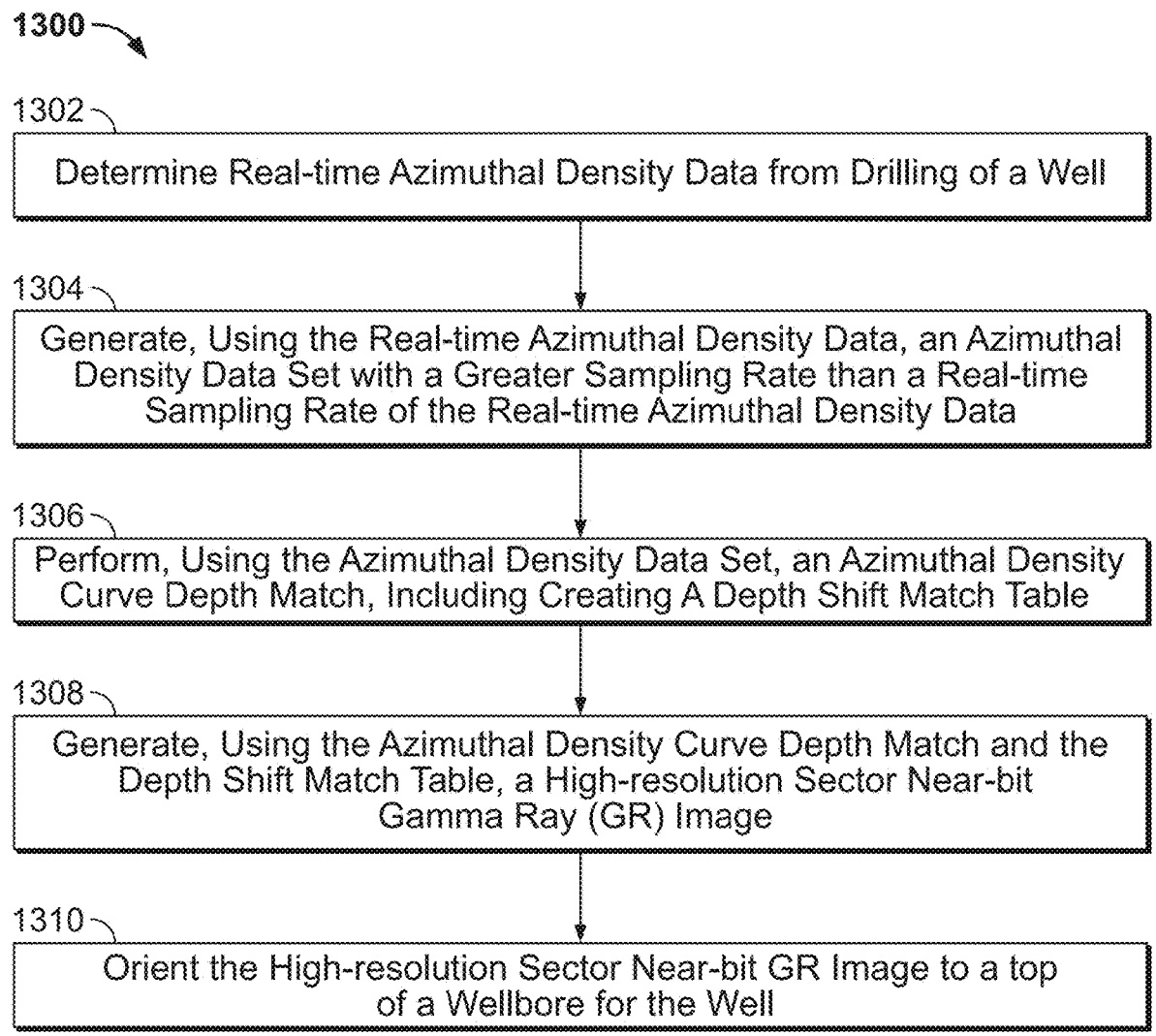
FIG. 13 is a flowchart of an example of a method for generating a real-time gamma ray (GR) image from a GR curve, according to some implementations of the present disclosure.

FIG. 13 is a flowchart of an example of a method 1300 for generating a real-time gamma ray (GR) image from a GR curve, according to some implementations of the present disclosure. For clarity of presentation, the description that follows generally describes method 1300 in the context of the other figures in this description. However, it will be understood that method 1300 can be performed, for example, by any suitable system, environment, software, and hardware, or a combination of systems, environments, software, and hardware, as appropriate. In some implementations, various steps of method 1300 can be run in parallel, in combination, in loops, or in any order.

At 1302, real-time azimuthal density data is determined from the drilling of a well. The real-time azimuthal density data can be downloaded, including four azimuthal density curves (e.g., as described with reference to FIG. 5A) and the sixteen bin density image (FIG. 5B), survey data, and near bit GR log. From 1302, method 1300 proceeds to 1304.

At 1304, an azimuthal density data set is generated using the real-time azimuthal density data. The azimuthal density data set is generated, for example, with a greater sampling rate than a real-time sampling rate of the real-time azimuthal density data. From 1304, method 1300 proceeds to 1306.

At 1306, an azimuthal density curve depth match is performed using the azimuthal density data set. Performing the azimuthal density curve depth match includes creating a depth shift match table. From 1306, method 1300 proceeds to 1308.

At 1308, a high-resolution sector near-bit gamma ray (GR) image is generated using the azimuthal density curve depth match and the depth shift match table. For example, the data from step 1302 can be uploaded to a third-party software for artificial near bit GR image creation. From 1308, method 1300 proceeds to 1310.

At 1310, the high-resolution sector near-bit GR image is oriented to a top of a wellbore for the well. The orientation can be done, for example, by associating the image data with bit size, hole deviation, and hole azimuth data. After 1310, method 1300 can stop.

In some implementations, in addition to (or in combination with) any previously-described features, techniques of the present disclosure can include the following. Customized user interfaces can present intermediate or final results of the above described processes to a user. The presented information can be presented in one or more textual, tabular, or graphical formats, such as through a dashboard. The information can be presented at one or more on-site locations (such as at an oil well or other facility), on the Internet (such as on a webpage), on a mobile application (or "app"), or at a central processing facility. The presented information can include suggestions, such as suggested changes in parameters or processing inputs, that the user can select to implement improvements in a production environment, such as in the exploration, production, and/or testing of petrochemical processes or facilities. For example, the suggestions can include parameters that, when selected by the user, can cause a change or an improvement in drilling parameters (including speed and direction) or overall production of a gas or oil well. The suggestions, when implemented by the user, can improve the speed and accuracy of calculations, streamline processes, improve models, and solve problems related to efficiency, performance, safety, reliability, costs, downtime, and the need for human interaction. In some implementations, the suggestions can be implemented in real-time, such as to provide an immediate or near-immediate change in operations or in a model. The term real-time can correspond, for example, to events that occur within a specified period of time, such as within one minute or within one second. In some implementations, values of parameters or other variables that are determined can be used automatically (such as through using rules) to implement changes in oil or gas well exploration, production/drilling, or testing. For example, outputs of the present disclosure can be used as inputs to other equipment and/or systems at a facility. This can be especially useful for systems or various pieces of equipment that are located several meters or several miles apart, or are located in different countries or other jurisdictions.

Figure 14:
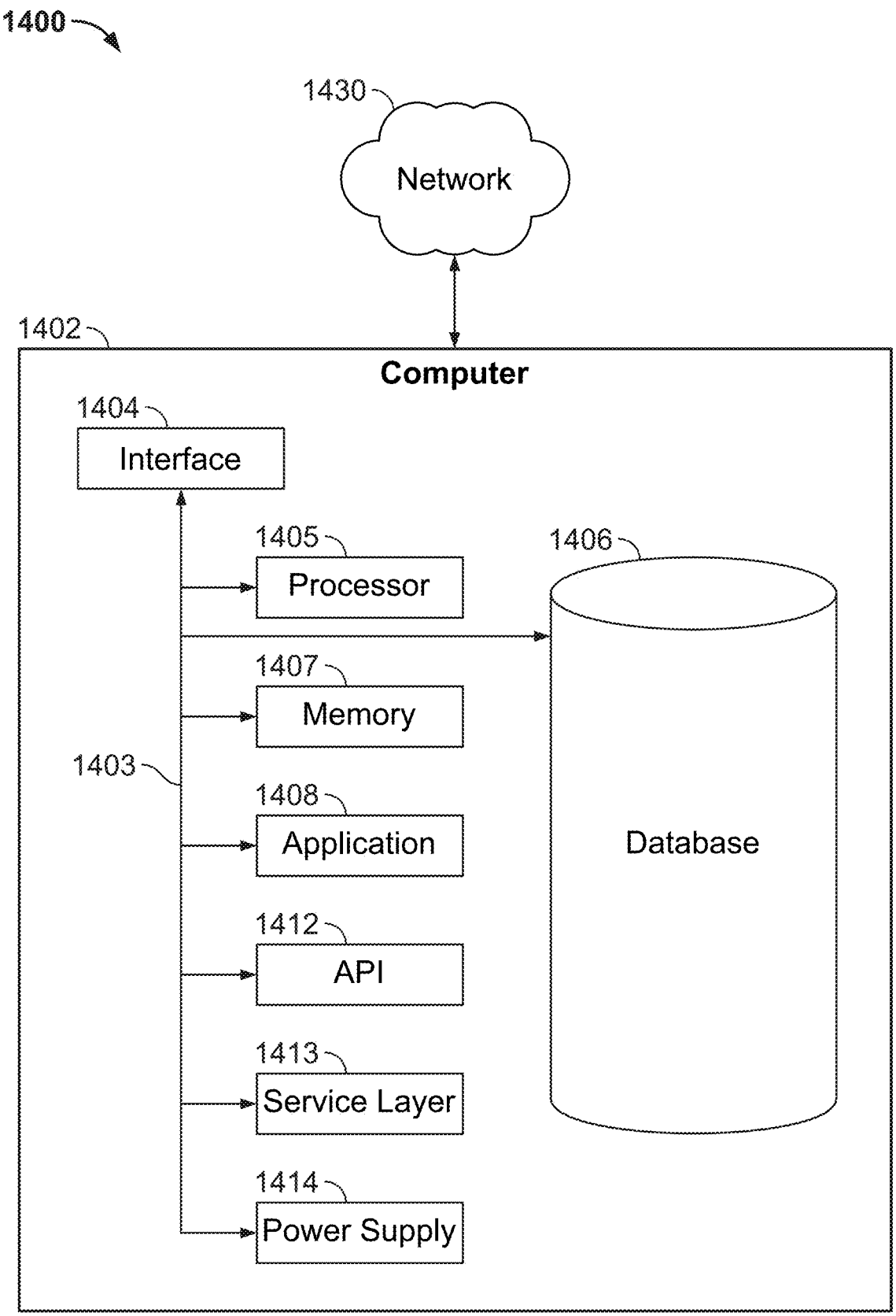
FIG. 14 is a block diagram illustrating an example computer system used to provide computational functionalities associated with described algorithms, methods, functions, processes, flows, and procedures as described in the present disclosure, according to some implementations of the present disclosure.

FIG. 14 is a block diagram of an example computer system 1400 used to provide computational functionalities associated with described algorithms, methods, functions, processes, flows, and procedures described in the present disclosure, according to some implementations of the present disclosure. The illustrated computer 1402 is intended to encompass any computing device such as a server, a desktop computer, a laptop/notebook computer, a wireless data port, a smart phone, a personal data assistant (PDA), a tablet computing device, or one or more processors within these devices, including physical instances, virtual instances, or both. The computer 1402 can include input devices such as keypads, keyboards, and touch screens that can accept user information. Also, the computer 1402 can include output devices that can convey information associated with the operation of the computer 1402. The information can include digital data, visual data, audio information, or a combination of information. The information can be presented in a graphical user interface (UI) (or GUI).

The computer 1402 can serve in a role as a client, a network component, a server, a database, a persistency, or components of a computer system for performing the subject matter described in the present disclosure. The illustrated computer 1402 is communicably coupled with a network 1430. In some implementations, one or more components of the computer 1402 can be configured to operate within different environments, including cloud-computing-based environments, local environments, global environments, and combinations of environments.

At a top level, the computer 1402 is an electronic computing device operable to receive, transmit, process, store, and manage data and information associated with the described subject matter. According to some implementations, the computer 1402 can also include, or be communicably coupled with, an application server, an email server, a web server, a caching server, a streaming data server, or a combination of servers.

The computer 1402 can receive requests over network 1430 from a client application (for example, executing on another computer 1402). The computer 1402 can respond to the received requests by processing the received requests using software applications. Requests can also be sent to the computer 1402 from internal users (for example, from a command console), external (or third) parties, automated applications, entities, individuals, systems, and computers.

Each of the components of the computer 1402 can communicate using a system bus 1403. In some implementations, any or all of the components of the computer 1402, including hardware or software components, can interface with each other or the interface 1404 (or a combination of both) over the system bus 1403. Interfaces can use an application programming interface (API) 1412, a service layer 1413, or a combination of the API 1412 and service layer 1413. The API 1412 can include specifications for routines, data structures, and object classes. The API 1412 can be either computer-language independent or dependent. The API 1412 can refer to a complete interface, a single function, or a set of APIs.

The service layer 1413 can provide software services to the computer 1402 and other components (whether illustrated or not) that are communicably coupled to the computer 1402. The functionality of the computer 1402 can be accessible for all service consumers using this service layer. Software services, such as those provided by the service layer 1413, can provide reusable, defined functionalities through a defined interface. For example, the interface can be software written in JAVA, C++, or a language providing data in extensible markup language (XML) format. While illustrated as an integrated component of the computer 1402, in alternative implementations, the API 1412 or the service layer 1413 can be stand-alone components in relation to other components of the computer 1402 and other components communicably coupled to the computer 1402. Moreover, any or all parts of the API 1412 or the service layer 1413 can be implemented as child or sub-modules of another software module, enterprise application, or hardware module without departing from the scope of the present disclosure.

The computer 1402 includes an interface 1404. Although illustrated as a single interface 1404 in FIG. 14, two or more interfaces 1404 can be used according to particular needs, desires, or particular implementations of the computer 1402 and the described functionality. The interface 1404 can be used by the computer 1402 for communicating with other systems that are connected to the network 1430 (whether illustrated or not) in a distributed environment. Generally, the interface 1404 can include, or be implemented using, logic encoded in software or hardware (or a combination of software and hardware) operable to communicate with the network 1430. More specifically, the interface 1404 can include software supporting one or more communication protocols associated with communications. As such, the network 1430 or the interface's hardware can be operable to communicate physical signals within and outside of the illustrated computer 1402.

The computer 1402 includes a processor 1405. Although illustrated as a single processor 1405 in FIG. 14, two or more processors 1405 can be used according to particular needs, desires, or particular implementations of the computer 1402 and the described functionality. Generally, the processor 1405 can execute instructions and can manipulate data to perform the operations of the computer 1402, including operations using algorithms, methods, functions, processes, flows, and procedures as described in the present disclosure.

The computer 1402 also includes a database 1406 that can hold data for the computer 1402 and other components connected to the network 1430 (whether illustrated or not). For example, database 1406 can be an in-memory, conventional, or a database storing data consistent with the present disclosure. In some implementations, database 1406 can be a combination of two or more different database types (for example, hybrid in-memory and conventional databases) according to particular needs, desires, or particular implementations of the computer 1402 and the described functionality. Although illustrated as a single database 1406 in FIG. 14, two or more databases (of the same, different, or combination of types) can be used according to particular needs, desires, or particular implementations of the computer 1402 and the described functionality. While database 1406 is illustrated as an internal component of the computer 1402, in alternative implementations, database 1406 can be external to the computer 1402.

The computer 1402 also includes a memory 1407 that can hold data for the computer 1402 or a combination of components connected to the network 1430 (whether illustrated or not). Memory 1407 can store any data consistent with the present disclosure. In some implementations, memory 1407 can be a combination of two or more different types of memory (for example, a combination of semiconductor and magnetic storage) according to particular needs, desires, or particular implementations of the computer 1402 and the described functionality. Although illustrated as a single memory 1407 in FIG. 14, two or more memories 1407 (of the same, different, or combination of types) can be used according to particular needs, desires, or particular implementations of the computer 1402 and the described functionality. While memory 1407 is illustrated as an internal component of the computer 1402, in alternative implementations, memory 1407 can be external to the computer 1402.

The application 1408 can be an algorithmic software engine providing functionality according to particular needs, desires, or particular implementations of the computer 1402 and the described functionality. For example, application 1408 can serve as one or more components, modules, or applications. Further, although illustrated as a single application 1408, the application 1408 can be implemented as multiple applications 1408 on the computer 1402. In addition, although illustrated as internal to the computer 1402, in alternative implementations, the application 1408 can be external to the computer 1402.

The computer 1402 can also include a power supply 1414. The power supply 1414 can include a rechargeable or non-rechargeable battery that can be configured to be either user- or non-user-replaceable. In some implementations, the power supply 1414 can include power-conversion and management circuits, including recharging, standby, and power management functionalities. In some implementations, the power-supply 1414 can include a power plug to allow the computer 1402 to be plugged into a wall socket or a power source to, for example, power the computer 1402 or recharge a rechargeable battery.

There can be any number of computers 1402 associated with, or external to, a computer system containing computer 1402, with each computer 1402 communicating over network 1430. Further, the terms "client," "user," and other appropriate terminology can be used interchangeably, as appropriate, without departing from the scope of the present disclosure. Moreover, the present disclosure contemplates that many users can use one computer 1402 and one user can use multiple computers 1402.

Described implementations of the subject matter can include one or more features, alone or in combination.

For example, in a first implementation, a computer-implemented method includes the following. Real-time azimuthal density data is determined from drilling of a well. An azimuthal density data set is generated using the real-time azimuthal density data. The azimuthal density data set is generated with a greater sampling rate than a real-time sampling rate of the real-time azimuthal density data. An azimuthal density curve depth match is performed using the azimuthal density data set. Performing the azimuthal density curve depth match includes creating a depth shift match table. A high-resolution sector near-bit gamma ray (GR) image is generated using the azimuthal density curve depth match and the depth shift match table. The high-resolution sector near-bit GR image is oriented to a top of a wellbore for the well.

The foregoing and other described implementations can each, optionally, include one or more of the following features:

A first feature, combinable with any of the following features, where determining the real-time azimuthal density data from drilling of a well includes receiving downloaded real-time azimuthal density data, including four azimuthal density curves and a sixteen bin density image, survey data, and near bit GR log.

A second feature, combinable with any of the previous or following features, where generating the azimuthal density data set with the greater sampling rate than the real-time sampling rate of the real-time azimuthal density data includes using a higher sampling rate of 0.1 inch configured for borehole image creation.

A third feature, combinable with any of the previous or following features, where the depth shift match table includes a bottom value, an up value, and a measured depth (MD) value determined as a difference between the up value and the bottom value.

A fourth feature, combinable with any of the previous or following features, the method further including: generating a coefficient table defining, for each sector of multiple sectors, a coefficient relative to an MD value; and generating sector mages based on respective depths and using the coefficient table.

A fifth feature, combinable with any of the previous or following features, the method further including: generating a density composite plot for a cutting down section including five tracks and plotted relative to a depth index, the density composite plot including the depth index, an upper density curve, a depth difference between the upper density curve and a bottom density curve, the bottom density curve, and a density shift curve showing a shift between the bottom density curve and a shifted representation of the upper density curve.

A sixth feature, combinable with any of the previous or following features, the method further including: generating a density composite plot for a cutting up section including five tracks and plotted relative to a depth index, the density composite plot including the depth index, an upper density curve, a depth difference between the upper density curve and a bottom density curve, the bottom density curve, and a density shift curve showing a shift between the bottom density curve and a shifted representation of the upper density curve.

In a second implementation, a non-transitory, computer-readable medium stores one or more instructions executable by a computer system to perform operations including the following. Real-time azimuthal density data is determined from drilling of a well. An azimuthal density data set is generated using the real-time azimuthal density data. The azimuthal density data set is generated with a greater sampling rate than a real-time sampling rate of the real-time azimuthal density data. An azimuthal density curve depth match is performed using the azimuthal density data set. Performing the azimuthal density curve depth match includes creating a depth shift match table. A high-resolution sector near-bit gamma ray (GR) image is generated using the azimuthal density curve depth match and the depth shift match table. The high-resolution sector near-bit GR image is oriented to a top of a wellbore for the well.

The foregoing and other described implementations can each, optionally, include one or more of the following features:

A first feature, combinable with any of the following features, where determining the real-time azimuthal density data from drilling of a well includes receiving downloaded real-time azimuthal density data, including four azimuthal density curves and a sixteen bin density image, survey data, and near bit GR log.

A second feature, combinable with any of the previous or following features, where generating the azimuthal density data set with the greater sampling rate than the real-time sampling rate of the real-time azimuthal density data includes using a higher sampling rate of 0.1 inch configured for borehole image creation.

A third feature, combinable with any of the previous or following features, where the depth shift match table includes a bottom value, an up value, and a measured depth (MD) value determined as a difference between the up value and the bottom value.

A fourth feature, combinable with any of the previous or following features, the operations further including: generating a coefficient table defining, for each sector of multiple sectors, a coefficient relative to an MD value; and generating sector mages based on respective depths and using the coefficient table.

A fifth feature, combinable with any of the previous or following features, the operations further including: generating a density composite plot for a cutting down section including five tracks and plotted relative to a depth index, the density composite plot including the depth index, an upper density curve, a depth difference between the upper density curve and a bottom density curve, the bottom density curve, and a density shift curve showing a shift between the bottom density curve and a shifted representation of the upper density curve.

A sixth feature, combinable with any of the previous or following features, the operations further including: generating a density composite plot for a cutting up section including five tracks and plotted relative to a depth index, the density composite plot including the depth index, an upper density curve, a depth difference between the upper density curve and a bottom density curve, the bottom density curve, and a density shift curve showing a shift between the bottom density curve and a shifted representation of the upper density curve.

In a third implementation, a computer-implemented system includes one or more processors and a non-transitory computer-readable storage medium coupled to the one or more processors and storing programming instructions for execution by the one or more processors. The programming instructions instruct the one or more processors to perform operations including the following. Real-time azimuthal density data is determined from drilling of a well. An azimuthal density data set is generated using the real-time azimuthal density data. The azimuthal density data set is generated with a greater sampling rate than a real-time sampling rate of the real-time azimuthal density data. An azimuthal density curve depth match is performed using the azimuthal density data set. Performing the azimuthal density curve depth match includes creating a depth shift match table. A high-resolution sector near-bit gamma ray (GR) image is generated using the azimuthal density curve depth match and the depth shift match table. The high-resolution sector near-bit GR image is oriented to a top of a wellbore for the well.

The foregoing and other described implementations can each, optionally, include one or more of the following features:

A first feature, combinable with any of the following features, where determining the real-time azimuthal density data from drilling of a well includes receiving downloaded real-time azimuthal density data, including four azimuthal density curves and a sixteen bin density image, survey data, and near bit GR log.

A second feature, combinable with any of the previous or following features, where generating the azimuthal density data set with the greater sampling rate than the real-time sampling rate of the real-time azimuthal density data includes using a higher sampling rate of 0.1 inch configured for borehole image creation.

A third feature, combinable with any of the previous or following features, where the depth shift match table includes a bottom value, an up value, and a measured depth (MD) value determined as a difference between the up value and the bottom value.

A fourth feature, combinable with any of the previous or following features, the operations further including: generating a coefficient table defining, for each sector of multiple sectors, a coefficient relative to an MD value; and generating sector mages based on respective depths and using the coefficient table.

A fifth feature, combinable with any of the previous or following features, the operations further including: generating a density composite plot for a cutting down section including five tracks and plotted relative to a depth index, the density composite plot including the depth index, an upper density curve, a depth difference between the upper density curve and a bottom density curve, the bottom density curve, and a density shift curve showing a shift between the bottom density curve and a shifted representation of the upper density curve.

Implementations of the subject matter and the functional operations described in this specification can be implemented in digital electronic circuitry, in tangibly embodied computer software or firmware, in computer hardware, including the structures disclosed in this specification and their structural equivalents, or in combinations of one or more of them. Software implementations of the described subject matter can be implemented as one or more computer programs. Each computer program can include one or more modules of computer program instructions encoded on a tangible, non-transitory, computer-readable computer-storage medium for execution by, or to control the operation of, data processing apparatus. Alternatively, or additionally, the program instructions can be encoded in/on an artificially generated propagated signal. For example, the signal can be a machine-generated electrical, optical, or electromagnetic signal that is generated to encode information for transmission to a suitable receiver apparatus for execution by a data processing apparatus. The computer-storage medium can be a machine-readable storage device, a machine-readable storage substrate, a random or serial access memory device, or a combination of computer-storage mediums.

The terms "data processing apparatus," "computer," and "electronic computer device" (or equivalent as understood by one of ordinary skill in the art) refer to data processing hardware. For example, a data processing apparatus can encompass all kinds of apparatuses, devices, and machines for processing data, including by way of example, a programmable processor, a computer, or multiple processors or computers. The apparatus can also include special purpose logic circuitry including, for example, a central processing unit (CPU), a field-programmable gate array (FPGA), or an application-specific integrated circuit (ASIC). In some implementations, the data processing apparatus or special purpose logic circuitry (or a combination of the data processing apparatus or special purpose logic circuitry) can be hardware- or software-based (or a combination of both hardware- and software-based). The apparatus can optionally include code that creates an execution environment for computer programs, for example, code that constitutes processor firmware, a protocol stack, a database management system, an operating system, or a combination of execution environments. The present disclosure contemplates the use of data processing apparatuses with or without conventional operating systems, such as LINUX, UNIX, WINDOWS, MAC OS, ANDROID, or IOS.

A computer program, which can also be referred to or described as a program, software, a software application, a module, a software module, a script, or code, can be written in any form of programming language. Programming languages can include, for example, compiled languages, interpreted languages, declarative languages, or procedural languages. Programs can be deployed in any form, including as stand-alone programs, modules, components, subroutines, or units for use in a computing environment. A computer program can, but need not, correspond to a file in a file system. A program can be stored in a portion of a file that holds other programs or data, for example, one or more scripts stored in a markup language document, in a single file dedicated to the program in question, or in multiple coordinated files storing one or more modules, sub-programs, or portions of code. A computer program can be deployed for execution on one computer or on multiple computers that are located, for example, at one site or distributed across multiple sites that are interconnected by a communication network. While portions of the programs illustrated in the various figures may be shown as individual modules that implement the various features and functionality through various objects, methods, or processes, the programs can instead include a number of sub-modules, third-party services, components, and libraries. Conversely, the features and functionality of various components can be combined into single components as appropriate. Thresholds used to make computational determinations can be statically, dynamically, or both statically and dynamically determined.

The methods, processes, or logic flows described in this specification can be performed by one or more programmable computers executing one or more computer programs to perform functions by operating on input data and generating output. The methods, processes, or logic flows can also be performed by, and apparatus can also be implemented as, special purpose logic circuitry, for example, a CPU, an FPGA, or an ASIC.

Computers suitable for the execution of a computer program can be based on one or more of general and special purpose microprocessors and other kinds of CPUs. The elements of a computer are a CPU for performing or executing instructions and one or more memory devices for storing instructions and data. Generally, a CPU can receive instructions and data from (and write data to) a memory.

Graphics processing units (GPUs) can also be used in combination with CPUs. The GPUs can provide specialized processing that occurs in parallel to processing performed by CPUs. The specialized processing can include artificial intelligence (AI) applications and processing, for example. GPUs can be used in GPU clusters or in multi-GPU computing.

A computer can include, or be operatively coupled to, one or more mass storage devices for storing data. In some implementations, a computer can receive data from, and transfer data to, the mass storage devices including, for example, magnetic, magneto-optical disks, or optical disks. Moreover, a computer can be embedded in another device, for example, a mobile telephone, a personal digital assistant (PDA), a mobile audio or video player, a game console, a global positioning system (GPS) receiver, or a portable storage device such as a universal serial bus (USB) flash drive.

Computer-readable media (transitory or non-transitory, as appropriate) suitable for storing computer program instructions and data can include all forms of permanent/non-permanent and volatile/non-volatile memory, media, and memory devices. Computer-readable media can include, for example, semiconductor memory devices such as random access memory (RAM), read-only memory (ROM), phase change memory (PRAM), static random access memory (SRAM), dynamic random access memory (DRAM), erasable programmable read-only memory (EPROM), electrically erasable programmable read-only memory (EEPROM), and flash memory devices. Computer-readable media can also include, for example, magnetic devices such as tape, cartridges, cassettes, and internal/removable disks. Computer-readable media can also include magneto-optical disks and optical memory devices and technologies including, for example, digital video disc (DVD), CD-ROM, DVD+/−R, DVD-RAM, DVD-ROM, HD-DVD, and BLU-RAY.

The memory can store various objects or data, including caches, classes, frameworks, applications, modules, backup data, jobs, web pages, web page templates, data structures, database tables, repositories, and dynamic information. Types of objects and data stored in memory can include parameters, variables, algorithms, instructions, rules, constraints, and references. Additionally, the memory can include logs, policies, security or access data, and reporting files. The processor and the memory can be supplemented by, or incorporated into, special purpose logic circuitry.

Implementations of the subject matter described in the present disclosure can be implemented on a computer having a display device for providing interaction with a user, including displaying information to (and receiving input from) the user. Types of display devices can include, for example, a cathode ray tube (CRT), a liquid crystal display (LCD), a light-emitting diode (LED), and a plasma monitor. Display devices can include a keyboard and pointing devices including, for example, a mouse, a trackball, or a trackpad. User input can also be provided to the computer through the use of a touchscreen, such as a tablet computer surface with pressure sensitivity or a multi-touch screen using capacitive or electric sensing. Other kinds of devices can be used to provide for interaction with a user, including to receive user feedback including, for example, sensory feedback including visual feedback, auditory feedback, or tactile feedback. Input from the user can be received in the form of acoustic, speech, or tactile input. In addition, a computer can interact with a user by sending documents to, and receiving documents from, a device that the user uses. For example, the computer can send web pages to a web browser on a user's client device in response to requests received from the web browser.

The term "graphical user interface," or "GUI," can be used in the singular or the plural to describe one or more graphical user interfaces and each of the displays of a particular graphical user interface. Therefore, a GUI can represent any graphical user interface, including, but not limited to, a web browser, a touch-screen, or a command line interface (CLI) that processes information and efficiently presents the information results to the user. In general, a GUI can include a plurality of user interface (UI) elements, some or all associated with a web browser, such as interactive fields, pull-down lists, and buttons. These and other UI elements can be related to or represent the functions of the web browser.

Implementations of the subject matter described in this specification can be implemented in a computing system that includes a back-end component, for example, as a data server, or that includes a middleware component, for example, an application server. Moreover, the computing system can include a front-end component, for example, a client computer having one or both of a graphical user interface or a Web browser through which a user can interact with the computer. The components of the system can be interconnected by any form or medium of wireline or wireless digital data communication (or a combination of data communication) in a communication network. Examples of communication networks include a local area network (LAN), a radio access network (RAN), a metropolitan area network (MAN), a wide area network (WAN), Worldwide Interoperability for Microwave Access (WIMAX), a wireless local area network (WLAN) (for example, using 802.11 a/b/g/n or 802.20 or a combination of protocols), all or a portion of the Internet, or any other communication system or systems at one or more locations (or a combination of communication networks). The network can communicate with, for example, Internet Protocol (IP) packets, frame relay frames, asynchronous transfer mode (ATM) cells, voice, video, data, or a combination of communication types between network addresses.

The computing system can include clients and servers. A client and server can generally be remote from each other and can typically interact through a communication network. The relationship of client and server can arise by virtue of computer programs running on the respective computers and having a client-server relationship.

Cluster file systems can be any file system type accessible from multiple servers for read and update. Locking or consistency tracking may not be necessary since the locking of exchange file system can be done at application layer. Furthermore, Unicode data files can be different from non-Unicode data files.

While this specification contains many specific implementation details, these should not be construed as limitations on the scope of what may be claimed, but rather as descriptions of features that may be specific to particular implementations. Certain features that are described in this specification in the context of separate implementations can also be implemented, in combination, in a single implementation. Conversely, various features that are described in the context of a single implementation can also be implemented in multiple implementations, separately, or in any suitable sub-combination. Moreover, although previously described features may be described as acting in certain combinations and even initially claimed as such, one or more features from a claimed combination can, in some cases, be excised from the combination, and the claimed combination may be directed to a sub-combination or variation of a sub-combination.

Particular implementations of the subject matter have been described. Other implementations, alterations, and permutations of the described implementations are within the scope of the following claims as will be apparent to those skilled in the art. While operations are depicted in the drawings or claims in a particular order, this should not be understood as requiring that such operations be performed in the particular order shown or in sequential order, or that all illustrated operations be performed (some operations may be considered optional), to achieve desirable results. In certain circumstances, multitasking or parallel processing (or a combination of multitasking and parallel processing) may be advantageous and performed as deemed appropriate.

Moreover, the separation or integration of various system modules and components in the previously described implementations should not be understood as requiring such separation or integration in all implementations. It should be understood that the described program components and systems can generally be integrated together in a single software product or packaged into multiple software products.

Accordingly, the previously described example implementations do not define or constrain the present disclosure. Other changes, substitutions, and alterations are also possible without departing from the spirit and scope of the present disclosure.

Furthermore, any claimed implementation is considered to be applicable to at least a computer-implemented method; a non-transitory, computer-readable medium storing computer-readable instructions to perform the computer-implemented method; and a computer system including a computer memory interoperably coupled with a hardware processor configured to perform the computer-implemented method or the instructions stored on the non-transitory, computer-readable medium.

What is claimed is:

1. A computer-implemented method, comprising:
   determining real-time azimuthal density data from drilling of a well;
   generating, using the real-time azimuthal density data, an azimuthal density data set with a greater sampling rate than a real-time sampling rate of the real-time azimuthal density data;
   performing, using the azimuthal density data set, an azimuthal density curve depth match, including creating a depth shift match table;
   generating, using the azimuthal density curve depth match and the depth shift match table, a high-resolution sector near-bit gamma ray (GR) image; and
   orienting the high-resolution sector near-bit GR image to a top of a wellbore for the well.

2. The computer-implemented method of claim 1, wherein determining the real-time azimuthal density data from drilling of a well includes receiving downloaded real-time azimuthal density data, including four azimuthal density curves and a sixteen bin density image, survey data, and near bit GR log.

3. The computer-implemented method of claim 1, wherein generating the azimuthal density data set with the greater sampling rate than the real-time sampling rate of the real-time azimuthal density data includes using a higher sampling rate of 0.1 inch configured for borehole image creation.

4. The computer-implemented method of claim 1, wherein the depth shift match table includes a bottom value, an up value, and a measured depth (MD) value determined as a difference between the up value and the bottom value.

5. The computer-implemented method of claim 4, further comprising:
   generating a coefficient table defining, for each sector of multiple sectors, a coefficient relative to an MD value; and
   generating sector mages based on respective depths and using the coefficient table.

6. The computer-implemented method of claim 1, further comprising:
   generating a density composite plot for a cutting down section including five tracks and plotted relative to a depth index, the density composite plot including the depth index, an upper density curve, a depth difference between the upper density curve and a bottom density curve, the bottom density curve, and a density shift curve showing a shift between the bottom density curve and a shifted representation of the upper density curve.

7. The computer-implemented method of claim 1, further comprising:
   generating a density composite plot for a cutting up section including five tracks and plotted relative to a depth index, the density composite plot including the depth index, an upper density curve, a depth difference between the upper density curve and a bottom density curve, the bottom density curve, and a density shift curve showing a shift between the bottom density curve and a shifted representation of the upper density curve.

8. A non-transitory, computer-readable medium storing one or more instructions executable by a computer system to perform operations comprising:
   determining real-time azimuthal density data from drilling of a well;
   generating, using the real-time azimuthal density data, an azimuthal density data set with a greater sampling rate than a real-time sampling rate of the real-time azimuthal density data;
   performing, using the azimuthal density data set, an azimuthal density curve depth match, including creating a depth shift match table;
   generating, using the azimuthal density curve depth match and the depth shift match table, a high-resolution sector near-bit gamma ray (GR) image; and
   orienting the high-resolution sector near-bit GR image to a top of a wellbore for the well.

9. The non-transitory, computer-readable medium of claim 8, wherein determining the real-time azimuthal density data from drilling of a well includes receiving downloaded real-time azimuthal density data, including four azimuthal density curves and a sixteen bin density image, survey data, and near bit GR log.

10. The non-transitory, computer-readable medium of claim 8, wherein generating the azimuthal density data set with the greater sampling rate than the real-time sampling rate of the real-time azimuthal density data includes using a higher sampling rate of 0.1 inch configured for borehole image creation.

11. The non-transitory, computer-readable medium of claim 8, wherein the depth shift match table includes a bottom value, an up value, and a measured depth (MD) value determined as a difference between the up value and the bottom value.

12. The non-transitory, computer-readable medium of claim 11, the operations further comprising:
   generating a coefficient table defining, for each sector of multiple sectors, a coefficient relative to an MD value; and
   generating sector mages based on respective depths and using the coefficient table.

13. The non-transitory, computer-readable medium of claim 8, the operations further comprising:

generating a density composite plot for a cutting down section including five tracks and plotted relative to a depth index, the density composite plot including the depth index, an upper density curve, a depth difference between the upper density curve and a bottom density curve, the bottom density curve, and a density shift curve showing a shift between the bottom density curve and a shifted representation of the upper density curve.

14. The non-transitory, computer-readable medium of claim 8, the operations further comprising:

generating a density composite plot for a cutting up section including five tracks and plotted relative to a depth index, the density composite plot including the depth index, an upper density curve, a depth difference between the upper density curve and a bottom density curve, the bottom density curve, and a density shift curve showing a shift between the bottom density curve and a shifted representation of the upper density curve.

15. A computer-implemented system, comprising:
one or more processors; and
a non-transitory computer-readable storage medium coupled to the one or more processors and storing programming instructions for execution by the one or more processors, the programming instructions instructing the one or more processors to perform operations comprising:
    determining real-time azimuthal density data from drilling of a well;
    generating, using the real-time azimuthal density data, an azimuthal density data set with a greater sampling rate than a real-time sampling rate of the real-time azimuthal density data;
    performing, using the azimuthal density data set, an azimuthal density curve depth match, including creating a depth shift match table;
    generating, using the azimuthal density curve depth match and the depth shift match table, a high-resolution sector near-bit gamma ray (GR) image; and
    orienting the high-resolution sector near-bit GR image to a top of a wellbore for the well.

16. The computer-implemented system of claim 15, wherein determining the real-time azimuthal density data from drilling of a well includes receiving downloaded real-time azimuthal density data, including four azimuthal density curves and a sixteen bin density image, survey data, and near bit GR log.

17. The computer-implemented system of claim 15, wherein generating the azimuthal density data set with the greater sampling rate than the real-time sampling rate of the real-time azimuthal density data includes using a higher sampling rate of 0.1 inch configured for borehole image creation.

18. The computer-implemented system of claim 15, wherein the depth shift match table includes a bottom value, an up value, and a measured depth (MD) value determined as a difference between the up value and the bottom value.

19. The computer-implemented system of claim 18, the operations further comprising:
    generating a coefficient table defining, for each sector of multiple sectors, a coefficient relative to an MD value; and
    generating sector mages based on respective depths and using the coefficient table.

20. The computer-implemented system of claim 15, the operations further comprising:
    generating a density composite plot for a cutting down section including five tracks and plotted relative to a depth index, the density composite plot including the depth index, an upper density curve, a depth difference between the upper density curve and a bottom density curve, the bottom density curve, and a density shift curve showing a shift between the bottom density curve and a shifted representation of the upper density curve.

\* \* \* \* \*